(12) United States Patent
Todorokihara

(10) Patent No.: US 11,121,717 B2
(45) Date of Patent: Sep. 14, 2021

(54) A/D CONVERSION CIRCUIT

(71) Applicant: Seiko Epson Corporation, Tokyo (JP)

(72) Inventor: Masayoshi Todorokihara, Suwa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/035,987

(22) Filed: Sep. 29, 2020

(65) Prior Publication Data
US 2021/0099181 A1     Apr. 1, 2021

(30) Foreign Application Priority Data
Sep. 30, 2019    (JP) .............................. JP2019-178864

(51) Int. Cl.
*H03M 1/06*    (2006.01)
*H03M 1/56*    (2006.01)

(52) U.S. Cl.
CPC ............ *H03M 1/0607* (2013.01); *H03M 1/56* (2013.01)

(58) Field of Classification Search
CPC .............................. H03M 1/0607; H03M 1/56
USPC .................................. 341/118, 155, 157–158
See application file for complete search history.

(56) References Cited

U.S. PATENT DOCUMENTS

| | | | |
|---|---|---|---|
| 10,175,655 B2 * | 1/2019 | Mahajan | .................... G06F 1/12 |
| 2003/0201927 A1 | 10/2003 | Watanabe et al. | |
| 2010/0237923 A1 | 9/2010 | Terazawa et al. | |

FOREIGN PATENT DOCUMENTS

| | | | |
|---|---|---|---|
| JP | 2004-007385 A | 1/2004 |
| JP | 2008-187537 A | 8/2008 |
| JP | 2010-226211 A | 10/2010 |
| JP | 2016-181735 A | 10/2016 |

* cited by examiner

*Primary Examiner* — Khai M Nguyen
(74) *Attorney, Agent, or Firm* — Harness, Dickey & Pierce, P.L.C.

(57) ABSTRACT

An A/D conversion circuit includes a comparison-reference-signal generator section configured to generate a comparison reference signal synchronized with a sampling clock signal, a comparator configured to compare a voltage of an input signal and a voltage of the comparison reference signal to thereby generate a trigger signal, a time to digital converter configured to calculate a first time digital value, and a digital-signal generator section configured to generate, based on the first time digital value and a second time digital value, a digital signal corresponding to the voltage of the input signal. The first time to digital converter includes a state transition section configured to start transition of a state based on the trigger signal and output state information, and a weight operation section configured to, in synchronization with the reference clock signal, perform, on a value based on the state information, weighting corresponding to time elapsing and perform a predetermined arithmetic operation to thereby calculate the first time digital value corresponding to the number of transition times of the state.

9 Claims, 20 Drawing Sheets

| PD | CLK_ref edge No. | 0 | 1 | 2 | 3 | 4 | 5 | 6 | 7 | 8 | 9 | 10 | 11 | 12 |
|---|---|---|---|---|---|---|---|---|---|---|---|---|---|---|
| T×0.5 | ST | 0 | 4 | 12 | 20 | 29 | 37 | 45 | 54 | 62 | 64 | 64 | 64 | 64 |
| | TD | 0 | 4 | 16 | 36 | 65 | 102 | 147 | 201 | 263 | 327 | 391 | 455 | 519 |
| T×0.7 | ST | 0 | 2 | 10 | 19 | 27 | 35 | 44 | 52 | 60 | 64 | 64 | 64 | 64 |
| | TD | 0 | 2 | 12 | 31 | 58 | 93 | 137 | 189 | 249 | 313 | 377 | 441 | 505 |
| T×1.7 | ST | 0 | 0 | 2 | 10 | 19 | 27 | 35 | 44 | 52 | 60 | 64 | 64 | 64 |
| | TD | 0 | 0 | 2 | 12 | 31 | 58 | 93 | 137 | 189 | 249 | 313 | 377 | 441 |
| T×2.7 | ST | 0 | 0 | 0 | 2 | 10 | 19 | 27 | 35 | 44 | 52 | 60 | 64 | 64 |
| | TD | 0 | 0 | 0 | 2 | 12 | 31 | 58 | 93 | 137 | 189 | 249 | 313 | 377 |
| T×3.7 | ST | 0 | 0 | 0 | 0 | 2 | 10 | 19 | 27 | 35 | 44 | 52 | 60 | 64 |
| | TD | 0 | 0 | 0 | 0 | 2 | 12 | 31 | 58 | 93 | 137 | 189 | 249 | 313 |

| PD | T×0.5 | T×0.7 | T×1.7 | T×2.7 | T×3.7 |
|---|---|---|---|---|---|
| TD | 519 | 505 | 441 | 377 | 313 |
| ΔTD | — | −14 | −64 | −64 | −64 |

FIG. 24

| PRESENT STATE | q[2] | q[1] | q[0] | dout | NEXT STATE | |
|---|---|---|---|---|---|---|
| | | | | | CK=0 | CK=1 |
| T0 | 0 | 0 | 0 | 0 | T0 | T1 |
| T1 | 0 | 0 | 1 | 1 | T2 | T1 |
| T2 | 0 | 1 | 1 | 0 | T2 | T3 |
| T3 | 0 | 1 | 0 | 1 | T4 | T3 |
| T4 | 1 | 1 | 0 | 0 | T4 | T5 |
| T5 | 1 | 1 | 1 | 1 | T6 | T5 |
| T6 | 1 | 0 | 1 | 0 | T6 | T7 |
| T7 | 1 | 0 | 0 | 1 | T0 | T7 |

A/D CONVERSION CIRCUIT

The present application is based on, and claims priority from JP Application Serial Number 2019-178864, filed Sep. 30, 2019, the disclosure of which is hereby incorporated by reference herein in its entirety.

BACKGROUND

1. Technical Field

The present disclosure relates to an A/D conversion circuit.

2. Related Art

JP-A-2004-7385 (Patent Literature 1) describes an A/D conversion device that supplies an input signal to a plurality of delay units configuring a pulse delay circuit to modulate delay times of the delay units, digitizes a pulse position, which is the number of the delay units through which a pulse signal passes per one cycle of a sampling clock, to thereby A/D-convert the input signal. In the A/D conversion device described in Patent Literature 1, each of a plurality of pulse-position digitizer sections receives an input of each of a plurality of sampling clocks having phases different from one another and digitizes a numerical value data obtained by the pulse-position digitizer sections and generates numerical value data representing a final A/D conversion result. Therefore, with the A/D conversion device described in Patent Literature 1, accuracy deterioration due to fluctuation in delay amounts of the plurality of delay units is reduced. An analog signal can be highly accurately converted into a digital value.

However, in the A/D conversion device described in Patent Literature 1, in order to reduce accuracy deterioration due to the fluctuation in the plurality of delay units, a plurality of pulse-position digitizer sections and a circuit that generates a plurality of sampling clocks having phases different from one another are necessary. The circuit needs to be complicated.

SUMMARY

An A/D conversion circuit according to an aspect of the present disclosure includes: a comparison-reference-signal generator section configured to generate a comparison reference signal, which has a specific waveform, synchronized with a sampling clock signal; a comparator configured to compare a voltage of an input signal and a voltage of the comparison reference signal to thereby generate a first trigger signal; a first time to digital converter configured to calculate a first time digital value corresponding to a phase difference between a reference clock signal and the first trigger signal; and a digital-signal generator section configured to generate, based on the first time digital value and a second time digital value corresponding to a phase difference between the reference clock signal and a second trigger signal based on the sampling clock signal, a digital signal corresponding to the voltage of the input signal. The first time to digital converter includes: a first state transition section configured to start transition of a state based on the first trigger signal and output first state information indicating the state; and a first weight operation section configured to, in synchronization with the reference clock signal, perform, on a value based on the first state information, perform, on a value based on the first state information where the value is weighted by (the) elapsed time, to thereby calculate the first time digital value corresponding to a number of transition times of the state of the first state transition section.

In the A/D conversion circuit according to the aspect, the first state transition section may start the transition of the state based on the second trigger signal and output second state information indicating the state, and the first weight operation section may perform, on a value based on the second state information, the weighting corresponding to the time elapsing and perform the arithmetic operation in synchronization with the reference clock signal to thereby calculate the second time digital value corresponding to the number of transition times of the state of the first state transition section.

The A/D conversion circuit may further include a second time to digital converter configured to calculate the second time digital value, and the second time to digital converter may include: a second state transition section configured to start transition of a state based on the second trigger signal and output second state information indicating the state; and a second weight operation section configured to, in synchronization with the reference clock signal, perform, on a value based on the second state information, weighting corresponding to time elapsing and perform the arithmetic operation to thereby calculate the second time digital value corresponding to a number of transition times of the state of the second state transition section.

The A/D conversion circuit according to the aspect may further include a third time to digital converter configured to calculate a third time digital value corresponding to a phase difference between the reference clock signal and a third trigger signal synchronized with the first trigger signal, the third time to digital converter may include: a third state transition section configured to start transition of a state based on the third trigger signal and output third state information indicating the state; and a third weight operation section configured to, in synchronization with the reference clock signal, perform, on a value based on the third state information, weighing corresponding to time elapsing and perform the arithmetic operation to thereby calculate the third time digital value corresponding to a number of transition times of the state of the third state transition section, and the digital-signal generator section may generate the digital signal based on, the first time digital value, the second time digital value, and the third time digital value.

In the A/D conversion circuit according to the aspect, the comparison-reference-signal generator section may include an integrator circuit configured to integrate the sampling clock signal and may generate the comparison reference signal based on an output signal of the integrator circuit.

The A/D conversion circuit according to the aspect, the digital-signal generator section may calculate a fluctuation amount of a time constant of the integrator circuit based on the first time digital value, the second time digital value, and a third time digital value corresponding to a phase difference between the reference clock signal and a third trigger signal synchronized with the first trigger signal and generate the digital signal compensated for the fluctuation amount.

The A/D conversion circuit according to the aspect may further include a sample hold circuit configured to sample and hold the input signal based on the sampling clock signal, and the comparator may compare a voltage of the input signal held by the sample hold circuit and the voltage of the comparison reference signal to thereby generate the first trigger signal.

In the A/D conversion circuit according to the aspect, the sampling clock signal may be synchronized with the reference clock signal.

In the A/D conversion circuit according to the aspect, the digital-signal generator section may subtract an offset value from the first time digital value and generate the digital signal based on the first time digital value from which the offset value is subtracted.

BRIEF DESCRIPTION OF THE DRAWINGS

FIG. 24 is a diagram showing a state transition table of a synchronized transition section.

DESCRIPTION OF EXEMPLARY EMBODIMENTS

Preferred embodiments of the present disclosure are explained in detail with reference to the drawings. The embodiments explained below do not unduly limit the content of the present disclosure described in the appended claims. Not all of components explained below are essential constituent elements of the present disclosure.

1. First Embodiment 1-1. Configuration of an A/D Conversion Circuit

Figure 1:
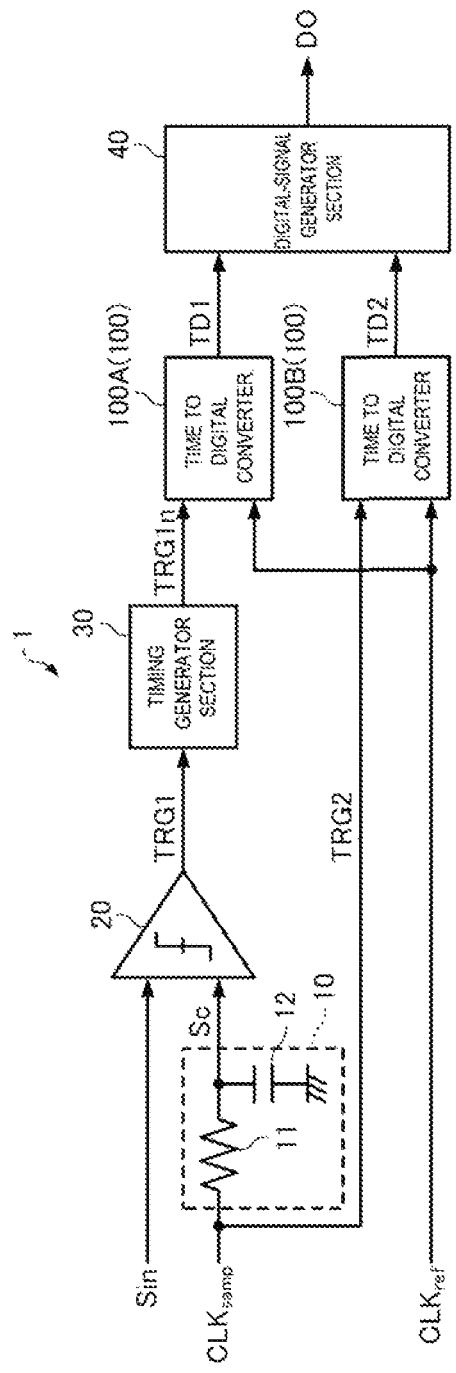
FIG. 1 is a diagram showing the configuration of an A/D conversion circuit in a first embodiment.

FIG. 1 is a diagram showing the configuration of an A/D conversion circuit in a first embodiment. As shown in FIG. 1, an A/D conversion circuit 1 in the first embodiment includes a comparison-reference-signal generator section 10, a comparator 20, a timing generator section 30, a digital-signal generator section 40, and time to digital converters 100A and 100B.

The comparison-reference-signal generator section 10 generates a comparison reference signal Sc, which has a specific waveform, synchronized with a sampling clock signal $CLK_{samp}$. In this embodiment, the comparison-reference-signal generator section 10 includes a resistor 11 and a capacitor 12. One end of the resistor 11 and one end of the capacitor 12 are electrically coupled. The other end of the capacitor 12 is grounded. The sampling clock signal $CLK_{samp}$ is input to the other end of the resistor 11. An integrator circuit that integrates the sampling clock signal $CLK_{samp}$ is configured by the resistor 11 and the capacitor 12. In this way, in this embodiment, the comparison-reference-signal generator section 10 includes the integrator circuit that integrates the sampling clock signal $CLK_{samp}$ and generates the comparison reference signal Sc based on an output signal of the integrator circuit. For example, the comparison reference signal Sc may be an output signal itself of the integrator circuit, may be a signal obtained by buffering the output signal of the integrator circuit, or may be a signal obtained by inverting a logic of the output signal of the integrator circuit.

The comparator 20 compares a voltage of an input signal Sin, which is an analog signal, and a voltage of the comparison reference signal Sc to thereby generate a trigger signal TRG1.

The timing generator section 30 generates, based on the trigger signal TRG1, a trigger signal TRG1n to indicate operation timing of the time to digital converter 100A.

The time to digital converter 100A receives an input of a reference clock signal $CLK_{ref}$ and the trigger signal TRG1n and calculates a time digital value TD1 corresponding to a phase difference between the reference clock signal $CLK_{ref}$ and the trigger signal TRG1n. Specifically, the time to digital converter 100A calculates the time digital value TD1 corresponding to a phase difference PD1 between a time event serving as a reference of the reference clock signal $CLK_{ref}$ and a time event of the trigger signal TRG1n.

The time event of the trigger signal TRG1n is timing when the trigger signal TRG1n changes and, for example, may be a rising edge or a falling edge of the trigger signal TRG1n or may be the rising edge and the falling edge of the trigger signal TRG1n.

The time event of the reference clock signal $CLK_{ref}$ is timing when the reference clock signal $CLK_{ref}$ changes and, for example, may be a rising edge or a falling edge of the reference clock signal $CLK_{ref}$ or may be the rising edge and the falling edge of the reference clock signal $CLK_{ref}$.

The time event serving as the reference of the reference clock signal $CLK_{ref}$ may be a time event of the reference clock signal $CLK_{ref}$ before the time event of the trigger signal TRG1n occurs and before the time event of a trigger signal TRG2 explained below occurs.

In this embodiment, the time event of the trigger signal TRG1n is timing substantially the same as the time event of the trigger signal TRG1. For example, when the time event of the trigger signal TRG1n is a rising edge and the time event of the trigger signal TRG1 is a rising edge, the rising edge of the trigger signal TRG1n is substantially the same timing as the rising edge of the trigger signal TRG1. Therefore, the time to digital converter 100A is considered to calculate the time digital value TD1 corresponding to the phase difference PD1 between the reference clock signal $CLK_{ref}$ and the trigger signal TRG1.

The time to digital converter 100B receives an input of the reference clock signal $CLK_{ref}$ and the trigger signal TRG2 and calculates a time digital value TD2 corresponding to a phase difference between the reference clock signal $CLK_{ref}$ and the trigger signal TRG2. Specifically, the time to digital converter 100A calculates the time digital value TD2 corresponding to a phase difference PD2 between the time event serving as the reference of the reference clock signal $CLK_{ref}$ and a time event of the trigger signal TRG2.

The trigger signal TRG2 is a signal based on a sampling clock signal $CLK_{samp}$ and, for example, may be the sampling clock signal $CLK_{samp}$ itself, may be a signal obtained by buffering the sampling clock signal $CLK_{samp}$, or may be a signal obtained by inverting a logic of the sampling clock signal $CLK_{samp}$.

The time event of the trigger signal TRG2 is timing when the trigger signal TRG2 changes and, for example, may be a rising edge or a falling edge of the trigger signal TRG2 or may be the rising edge and the falling edge of the trigger signal TRG2.

The digital-signal generator section 40 generates, based on the time digital value TD1 and the time digital value TD2, a digital signal DO corresponding to a voltage of the input signal Sin. Details of an arithmetic operation for the digital-signal generator section 40 to generate the digital signal DO are explained below.

In FIG. 1, the trigger signal TRG1 is equivalent to a "first trigger signal" and the trigger signal TRG2 is equivalent to a "second trigger signal". The time digital value TD1 is equivalent to a "first time digital value" and the time digital value TD2 is equivalent to a "second time digital value". The time to digital converter 100A is equivalent to a "first time to digital converter" and the time to digital converter 100B is equivalent to a "second time to digital converter".

1-2. Configuration of the Time to Digital Converter

In this embodiment, the time to digital converter 100A and the time to digital converter 100B have the same configuration. Signals input to the time to digital converter 100A and the time to digital converter 100B are different. Therefore, in the following explanation, a configuration example of a time to digital converter 100, which is the time to digital converter 100A or the time to digital converter 100B, is explained.

Figure 2:
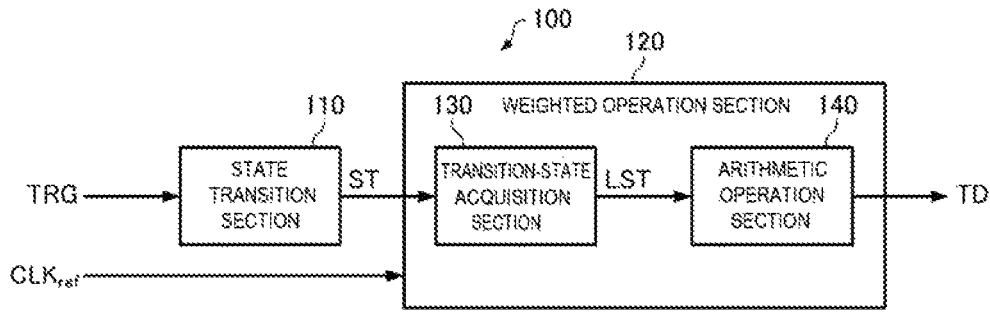
FIG. 2 is a diagram showing a configuration example of a time to digital converter.

FIG. 2 is a diagram showing a configuration example of the time to digital converter 100. The time to digital converter 100 shown in FIG. 2 generates a time digital value TD corresponding to a phase difference between the reference clock signal $CLK_{ref}$ and a trigger signal TRG. The trigger signal TRG is the trigger signal TRG1 or the trigger signal TRG2. The time digital value TD is the time digital value TD1 or the time digital value TD2.

As shown in FIG. 2, the time to digital converter 100 includes a state transition section 110 and a weight operation section 120.

The state transition section 110 starts transition of a state based on the trigger signal TRG and outputs a state value ST indicating the state.

The weight operation section 120 performs, on a value based on the state value ST, weighting corresponding to time elapsing and performs a predetermined arithmetic operation in synchronization with the reference clock signal $CLK_{ref}$ to thereby calculate the time digital value TD corresponding to the number of transition times of the state of the state transition section 110. In this embodiment, the weighting corresponding to the time elapsing is weighting corresponding to the number of time events of the reference clock signal $CLK_{ref}$. The weight operation section 120 may include a transition-state-acquisition section 130 and an arithmetic operation section 140. The transition-state-acquisition section 130 acquires and retains the state value ST every time a time event of the reference clock signal $CLK_{ref}$ occurs and outputs the retained value as a state value LST. The arithmetic operation section 140 performs, on the state value LST based on the state value ST, weighting corresponding to the number of time events of the reference clock signal $CLK_{ref}$ and performs a predetermined arithmetic operation to thereby generate the time digital value TD.

The state transition section 110 of the time to digital converter 100A is equivalent to a "first state transition section" and the state transition section 110 of the time to digital converter 100B is equivalent to a "second state transition section". The state value ST output from the state transition section 110 of the time to digital converter 100A is equivalent to "first state information" and the state value ST output from the state transition section 110 of the time to digital converter 100B is equivalent to "second state information". The weight operation section 120 of the time to digital converter 100A is equivalent to a "first weight operation section" and the weight operation section 120 of the time to digital converter 100B is equivalent to a "second weight operation section".

Figure 3:
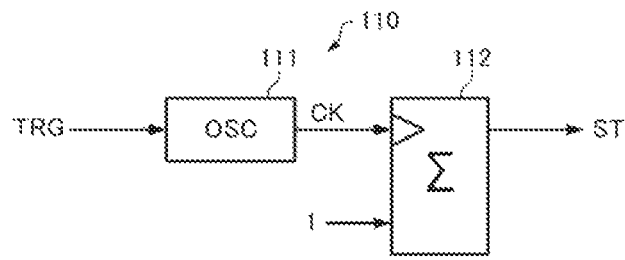
FIG. 3 is a diagram showing a configuration example of a state transition section.

FIG. 3 is a diagram showing a configuration example of the state transition section 110. As shown in FIG. 3, the state transition section 110 includes an oscillator section 111 and an accumulator 112.

The oscillator section 111 starts oscillation based on a time event of the trigger signal TRG and outputs a clock signal CK including a predetermined number of pulses.

The accumulator 112 accumulates 1 and outputs the state value ST every time a time event of the clock signal CK occurs. In other words, the accumulator 112 counts the time event of the clock signal CK and outputs the state value ST. When considering that the state of the state transition section 110 transitions every time the time event of the clock signal CK occurs, the state value ST is equivalent to the number of state transitions of the state transition section 110.

Figure 4:
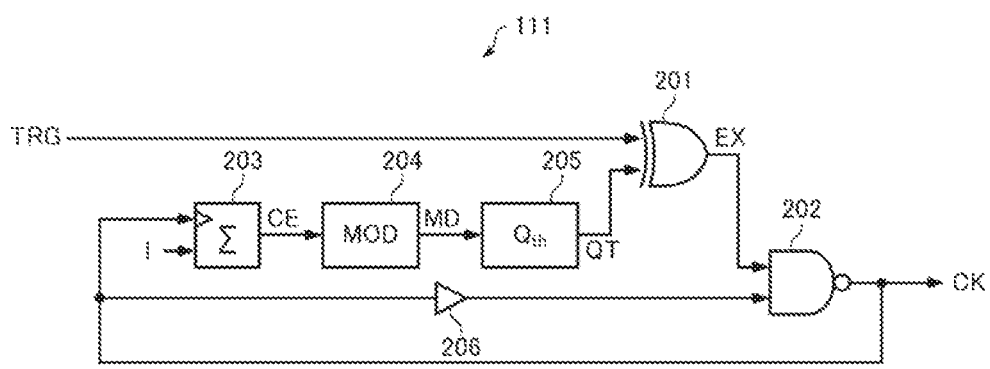
FIG. 4 is a diagram showing a configuration example of an oscillator section.

FIG. 4 is a diagram showing a configuration example of the oscillator section 111. As shown in FIG. 4, the oscillator section 111 includes an exclusive OR circuit 201, a NOT-AND circuit 202, an accumulator 203, a modulo operator 204, a quantizer 205, and a buffer circuit 206.

The exclusive OR circuit 201 outputs an exclusive OR signal EX of the trigger signal TRG and a quantized signal QT output from the quantizer 205. The exclusive OR signal EX is at a high level when a logical level of the trigger signal TRG and a logical level of the quantized signal QT are different and is at a low level when the logical level of the trigger signal TRG and the logical level of the quantized signal QT are the same.

The NOT-AND circuit 202 outputs the clock signal CK, which is an inverted AND signal of the exclusive OR signal EX and an output signal of the buffer circuit 206. The clock signal CK is at the low level when both of the exclusive OR signal EX and the output signal of the buffer circuit 206 are at the high level and is at the high level when at least one of the exclusive OR signal EX and the output signal of the buffer circuit 206 is at the low level.

The accumulator 203 accumulates 1 and outputs an accumulated value CE every time a time event of the clock signal CK occurs. In other words, the accumulator 203 counts the time event of the clock signal CK and outputs the accumulated value CE. The time event of the clock signal CK may be a rising edge or may be a falling edge or may be both of the rising edge and the falling edge.

The modulo operator 204 performs modulo operation with the accumulated value CE as a dividend and with a predetermined value as a divisor. That is, the modulo operator 204 outputs a remainder value MD obtained by dividing the accumulated value CE, which is the dividend, by the predetermined value, which is the divisor. The predetermined value, which is the divisor, is set as appropriate.

The quantizer 205 compares the remainder value MD with a predetermined threshold to thereby output the quantized signal QT obtained by quantizing the remainder value MD. In other words, the quantizer 205 outputs, as the quantized signal QT, a quotient obtained by dividing the remainder value MD, which is the dividend, by the threshold, which is the divisor.

The buffer circuit 206 outputs a signal obtained by buffering the clock signal CK. The output signal of the buffer circuit 206 is a signal obtained by delaying the clock signal CK.

Figure 5:
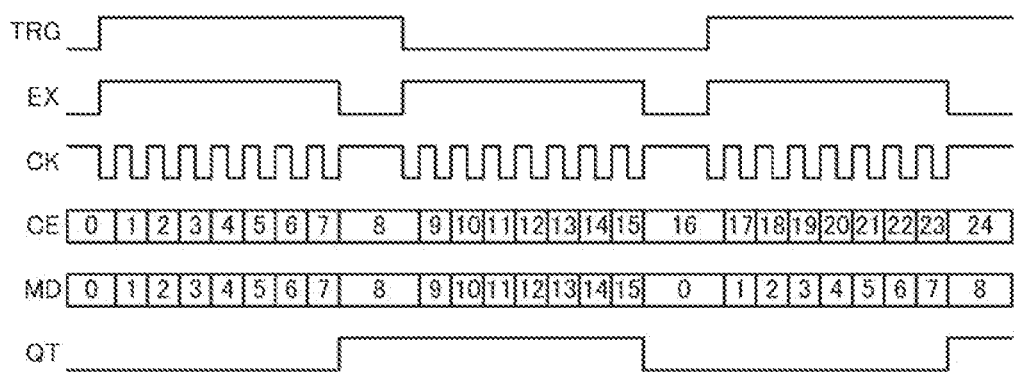
FIG. 5 is a timing chart showing an example of operation timing of the oscillator section.

FIG. 5 is a timing chart showing an example of operation timing of the oscillator section 111 shown in FIG. 4. FIG. 5 shows an example in which the divisor in the modulo operation by the modulo operator 204 is 16 and the threshold of the quantization by the quantizer 205 is 8.

In the example shown in FIG. 5, when the logical level of the trigger signal TRG changes, the exclusive OR signal EX changes from the low level to the high level. A pulse of the clock signal CK is continuously generated in a period in which the exclusive OR signal EX is at the high level. The accumulated value CE increases by 1 at every rising edge of the clock signal CK. The remainder value MD increases according to the increase in the accumulated value CE and is initialized to 0 every time the accumulated value CE reaches an integer time of 16. The quantized signal QT is at the low level when the remainder value MD is 7 or less and is at the high level when the remainder value MD is 8 or more. When the logical level of the quantized signal QT changes, the exclusive OR signal EX changes from the high level to the low level and the generation of the pulse of the clock signal CK stops.

In the example shown in FIG. 5, every time the logical level of the trigger signal TRG changes, the oscillator section 111 oscillates eight times, the logical level of the clock signal CK is inverted sixteen times, and the pulse is generated eight times. However, if the divisor in the modulo operation by the modulo operator 204 and the threshold of the quantization by the quantizer 205 are changed, the number of times of oscillation of the oscillator section 111 changes and the number of pulses of the clock signal CK also changes. For example, when the divisor in the modulo operation by the modulo operator 204 is 2p and the threshold of the quantization by the quantizer 205 is p, every time the logical level of the trigger signal TRG changes, the oscillator section 111 oscillates p times, the logical level of the clock signal CK is inverted 2p times, and p pulses are generated. In this case, an upper limit value of the state value ST equivalent to the number of state transitions of the state transition section 110 is p.

Figure 6:
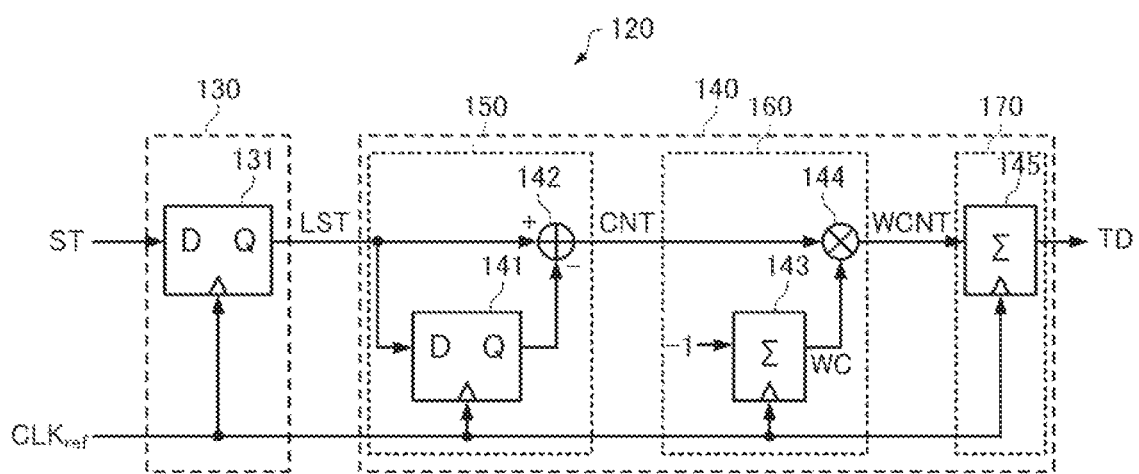
FIG. 6 is a diagram showing a configuration example of a weight operation section.

FIG. 6 is a diagram showing a configuration example of the weight operation section 120. As shown in FIG. 6, the weight operation section 120 includes a register 131, a register 141, a subtractor 142, an accumulator 143, a multiplier 144, and an accumulator 145.

The register 131 captures the state value ST and retains the state value ST as the state value LST in synchronization with the time event of the reference clock signal $CLK_{ref}$. The register 131 is configured by, for example, one or a plurality of D-type flip flops.

The register 141 captures and retains the state value LST in synchronization with the time event of the reference clock signal $CLK_{ref}$. The register 141 is configured by, for example, one or a plurality of D-type flip flops.

The subtractor 142 subtracts a value retained by the register 141 from the state value LST and outputs a count value CNT. The count value CNT is equivalent to an increase in the state value LST between continuous two time events of the reference clock signal $CLK_{ref}$. For example, if the time event of the reference clock signal $CLK_{ref}$ is a rising edge, the count value CNT is equivalent to the number of state transitions of the state transition section 110 in one cycle of the reference clock signal $CLK_{ref}$.

In this way, the register 141 and the subtractor 142 configure a state-transition counter section 150 that counts the number of state transitions of the state transition section 110.

The accumulator 143 accumulates −1 with an initial value and outputs a weight coefficient value WC every time the time event of the reference clock signal $CLK_{ref}$ occurs. In other words, the accumulator 143 outputs the weight coefficient value WC that decreases by 1 from the initial value every time the time event of the reference clock signal $CLK_{ref}$ occurs. The initial value of the weight coefficient value WC is set as appropriate.

The multiplier 144 multiplies the count value CNT by the weight coefficient value WC and outputs a weighted count value WCNT.

In this way, the accumulator 143 and the multiplier 144 configure a weighting section 160 that weights the count value CNT according to the number of time events of the reference clock signal $CLK_{ref}$.

The accumulator 145 accumulates the weighted count value WCNT and outputs the time digital value TD every time the time event of the reference clock signal $CLK_{ref}$ occurs. In this way, the accumulator 145 configures an accumulator section 170 that accumulates the weighted count value WCNT.

The register 131 is equivalent to the transition-state-acquisition section 130 shown in FIG. 2. The state-transition counter section 150, the weighting section 160, and the accumulator section 170 are equivalent to the arithmetic operation section 140 shown in FIG. 2.

In the time to digital converter 100 configured as explained above, when an i-th count value CNT, that is, the number of state transitions of the state transition section 110 in i-th one cycle of the reference clock signal $CLK_{ref}$ is represented as $m_i$ and the weight coefficient value WC in the i-th one cycle of the reference clock signal $CLK_{ref}$ is represented as $w_i$, the time digital value TD after N cycles of the reference clock signal $CLK_{ref}$ is represented by the following Expression (1).

$$TD = \sum_{i=1}^{N} w_i \cdot m_i \quad (1)$$

The time digital value TD is a value corresponding to a phase difference PD between the time event of the reference clock signal $CLK_{ref}$ and the time event of the trigger signal TRG. The phase difference PD is the phase difference PD1 or the phase difference PD2 explained above.

Figure 7:
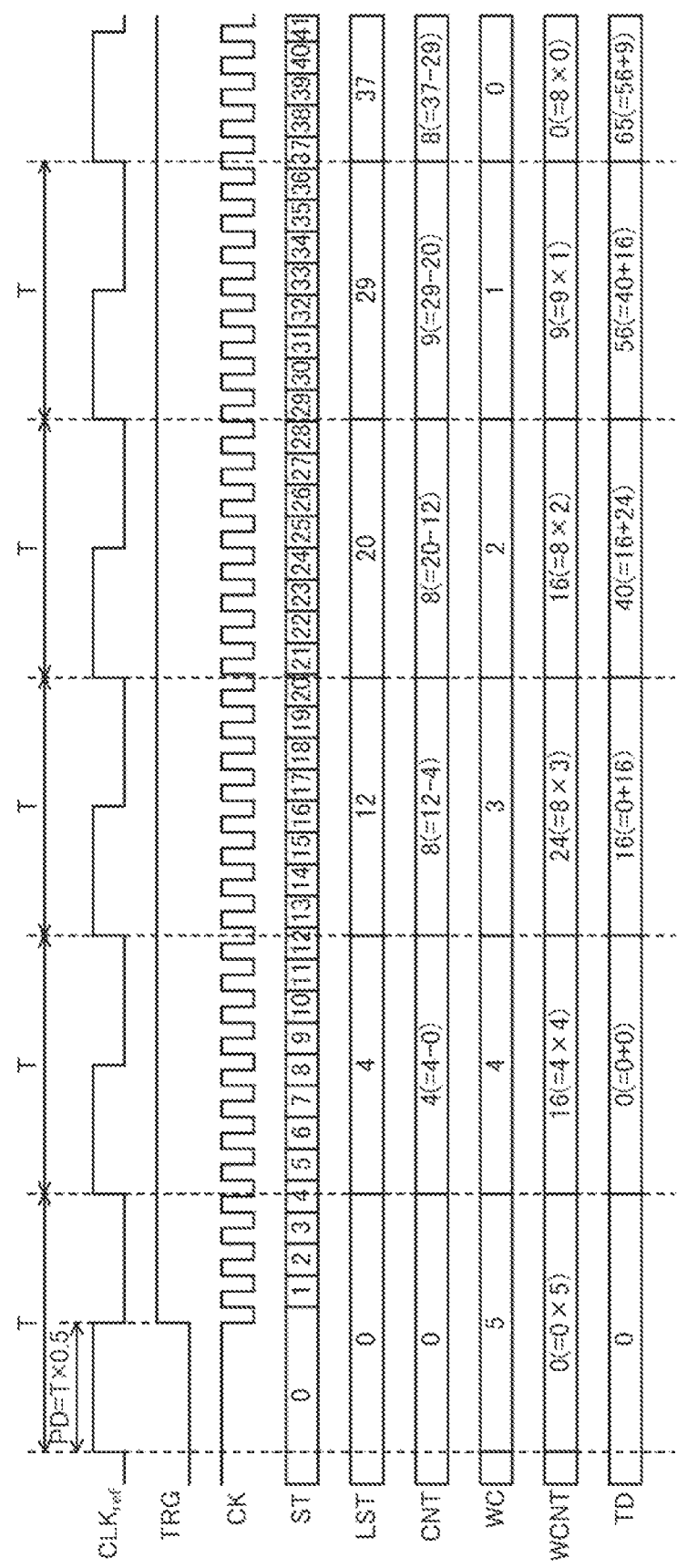
FIG. 7 is a timing chart showing an example of operation timing of the time to digital converter.
Figure 8:
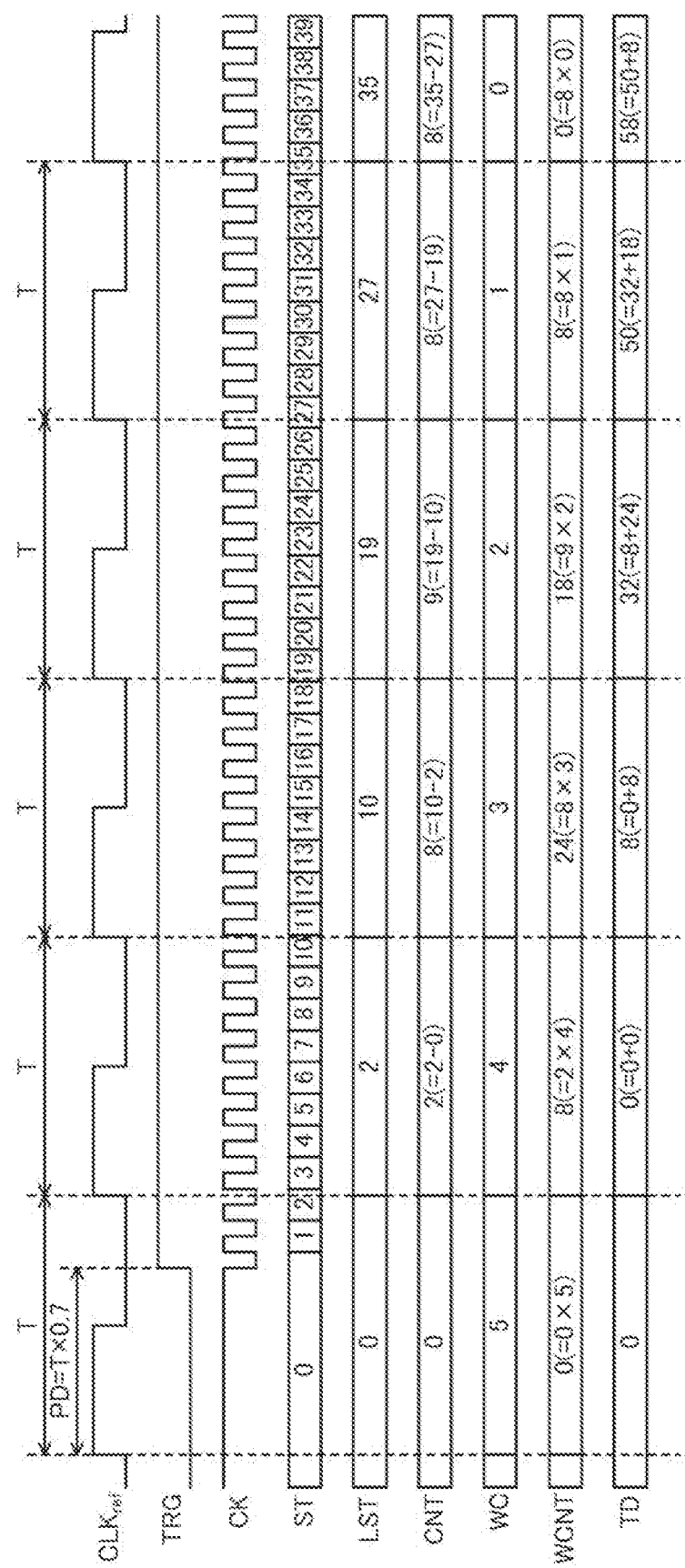
FIG. 8 is a timing chart showing an example of the operation timing of the time to digital converter.

FIGS. 7 and 8 are timing charts showing examples of operation timing of the time to digital converter 100. In FIGS. 7 and 8, the time event of the reference clock signal $CLK_{ref}$ is a rising edge. With respect to a time T of one cycle of the reference clock signal $CLK_{ref}$, the phase difference PD between the time event of the reference clock signal $CLK_{ref}$ and the time event of the trigger signal TRG is T×0.5 in the example shown in FIG. 7 and is T×0.7 in the example shown in FIG. 8. In the example shown in FIG. 7, when the time event of the trigger signal TRG occurs, every time the time event of the reference clock signal $CLK_{ref}$ occurs, the time digital value TD increases to 0, 16, 40, 56, 65 . . . In the example shown in FIG. 8, when the time event of the trigger signal TRG occurs, every time the time event of the reference clock signal $CLK_{ref}$ occurs, the time digital value TD increases to 0, 8, 32, 50, 58 . . . When FIG. 7 and FIG. 8 are compared, the time digital value TD in the example shown in FIG. 8 in which the phase difference PD is large is a smaller value than the time digital value TD in the example shown in FIG. 7 in which the phase difference PD is smaller. That is, the time to digital converter 100 outputs the time digital value TD that has a smaller value as the phase difference PD is larger. However, the time to digital converter 100 may output the time digital value TD that has a larger value as the phase difference PD is larger.

Although not illustrated in FIGS. 3 and 6, the state value ST and the time digital value TD are reset to 0 at predetermined timing until the logical level of the trigger signal TRG changes next after the state value ST reaches the upper limit value.

The time to digital converter 100 explained above is a time to digital converter of a weighted ΔΣ count value accumulator type that weights, with time, a difference of the state value ST obtained by counting the number of state transitions of the state transition section 110 and accumulates the difference to thereby generate the time digital value TD. A noise shaping is effectively exerted by the delta-sigma count value accumulation and, therefore, the time digital value TD with a high S/N ratio can be obtained.

1-3. Time to Digital Converter in a Modification

Figure 9:
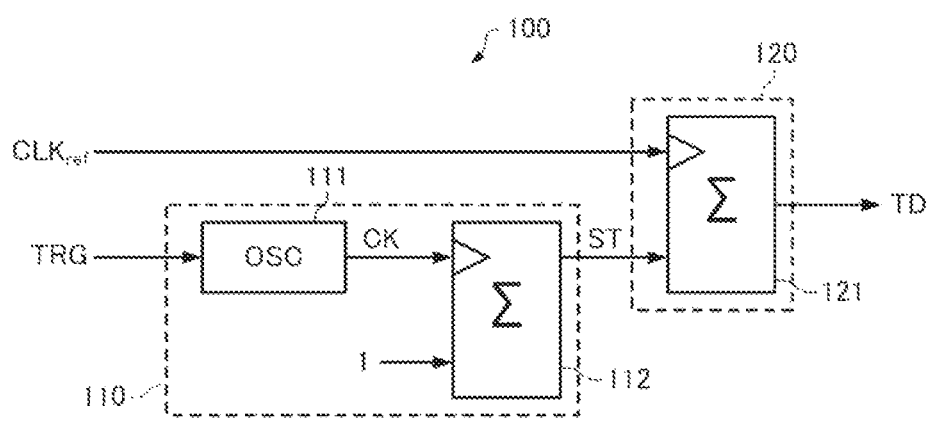
FIG. 9 is a diagram showing the configuration of the time to digital converter in a modification.

FIG. 9 is a diagram showing the configuration of the time to digital converter 100 shown in FIGS. 2, 3, and 6 in a modification.

The time to digital converter 100 shown in FIG. 9 includes the oscillator section 111, the accumulator 112, and an accumulator 121.

The oscillator section 111 starts oscillation based on the time event of the trigger signal TRG and outputs the clock signal CK including the predetermined number of pulses. The oscillator section 111 has, for example, the same configuration as the configuration shown in FIG. 4.

The accumulator 112 accumulates 1 and outputs the state value ST every time the time event of the clock signal CK occurs. In other words, the accumulator 112 counts the time event of the clock signal CK and outputs the state value ST. As explained above, the state value ST is equivalent to the number of state transitions of the state transition section 110.

The accumulator 121 accumulates the state value ST and outputs the time digital value TD every time the time event of the clock signal CK occurs. The time digital value TD is equivalent to an accumulated value of the number of state transitions of the state transition section 110.

The oscillator section 111 and the accumulator 112 are equivalent to the state transition section 110 shown in FIG. 2. The accumulator 112 is equivalent to the weight operation section 120 shown in FIG. 2.

In the time to digital converter 100 configured as explained above, the state value ST after i cycles of the reference clock signal $CLK_{ref}$, that is, an accumulated value $M_i$ of the number of state transitions of the state transition section 110 in first to i-th cycles of the reference clock signal $CLK_{ref}$ is represented by the following Expression (2).

$$M_i = \sum_{j=1}^{i} m_j \quad (2)$$

Therefore, the time digital value TD after N cycles of the reference clock signal $CLK_{ref}$ is represented by the following Expression (3).

$$TD = \sum_{i=1}^{N} M_i \quad (3)$$

When Expression (2) is substituted in Expression (3), the following Expression (4) is obtained.

$$TD = \sum_{i=1}^{N} \sum_{j=1}^{i} m_j = \sum_{i=1}^{N} (N+1-i) \cdot m_i \quad (4)$$

When Expression (4) is compared with Expression (1), N+1−i is equivalent to a weight coefficient value $w_i$ in i-th one cycle of the reference clock signal $CLK_{ref}$. Therefore, the time digital value TD generated by the time to digital converter 100 shown in FIG. 9 is the same as the time digital value TD of the time to digital converter 100 shown in FIGS. 2, 3, and 6 and is a value corresponding to the phase difference PD between the time event of the reference clock signal $CLK_{ref}$ and the time event of the trigger signal TRG.

Figure 10:
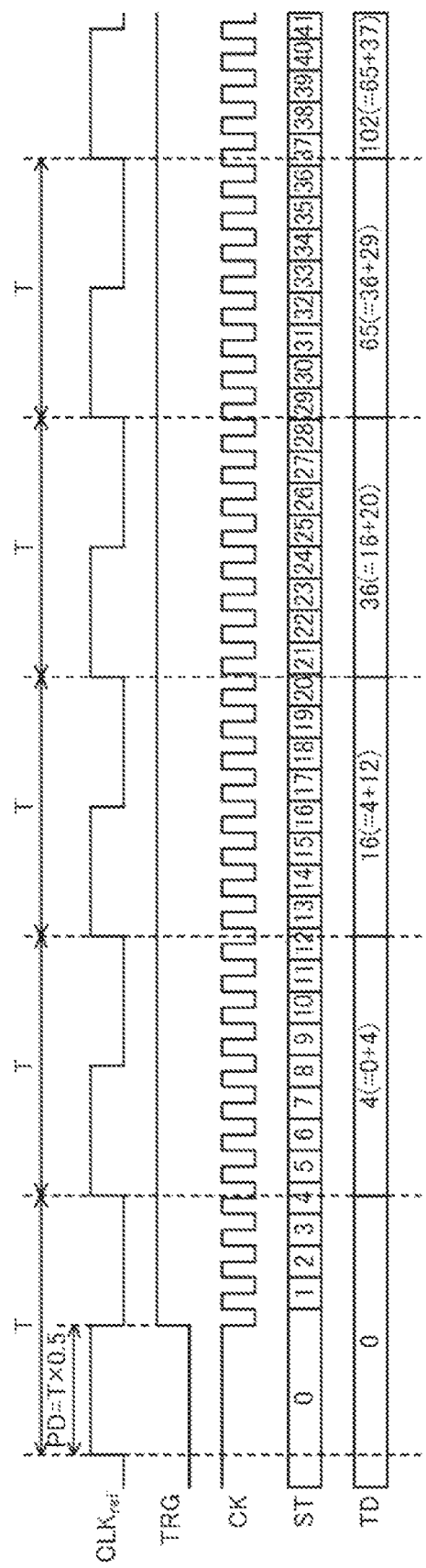
FIG. 10 is a timing chart showing an example of operation timing of the time to digital converter in the modification.
Figure 11:
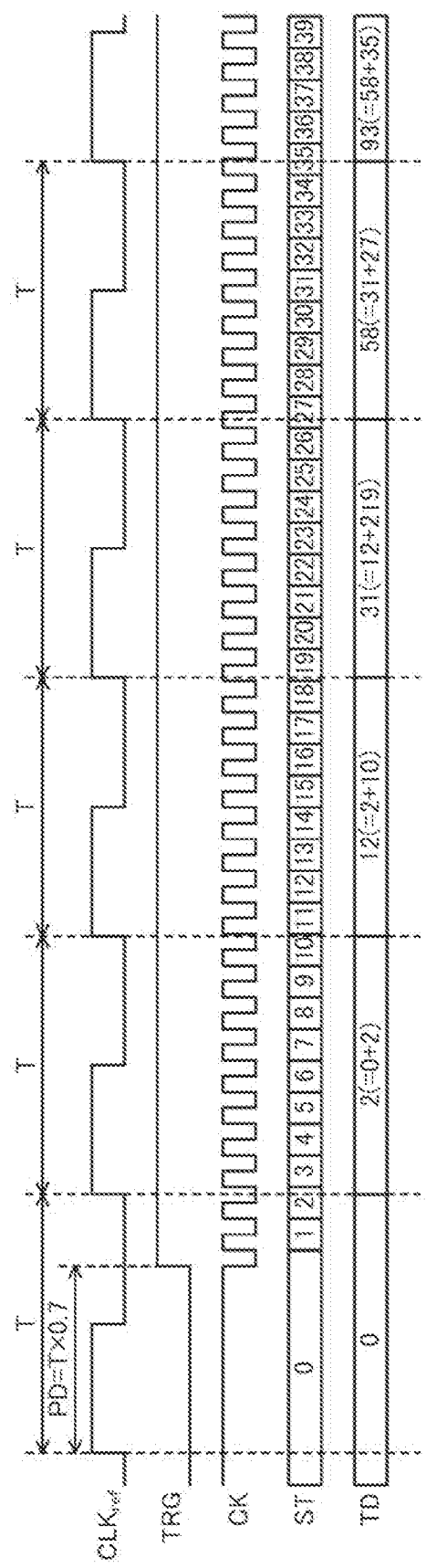
FIG. 11 is a timing chart showing an example of the operation timing of the time to digital converter in the modification.

FIGS. 10 and 11 are timing charts showing examples of operation timing of the time to digital converter 100 shown in FIG. 9. In FIGS. 10 and 11, the time event of the reference clock signal $CLK_{ref}$ is a rising edge. With respect to the time T of one cycle of the reference clock signal $CLK_{ref}$, the phase difference PD between the time event of the reference clock signal $CLK_{ref}$ and the time event of the trigger signal TRG is T×0.5 in the example shown in FIG. 10 and is T×0.7 in the example shown in FIG. 11. In the example shown in FIG. 10, when the time event of the trigger signal TRG occurs, every time the time event of the reference clock signal $CLK_{ref}$ occurs, the time digital value TD increases to 4, 16, 36, 65, 102 . . . In the example shown in FIG. 11, when the time event of the trigger signal TRG occurs, every time the time event of the reference clock signal $CLK_{ref}$ occurs, the time digital value TD increases to 2, 12, 31, 58, 93 . . . When FIG. 10 and FIG. 11 are compared, the time digital value TD in the example shown in FIG. 11 in which the phase difference PD is larger is a value smaller than the time digital value TD in the example shown in FIG. 10 in which the phase difference PD is smaller. That is, the time to digital converter 100 shown in FIG. 9 outputs the time digital value TD, which is a smaller value as the phase difference PD is larger, like the time to digital converter 100 shown in FIGS. 2, 3, and 6.

Although not shown in FIG. 9, at predetermined timing until the logical level of the trigger signal TRG changes next time after the state value ST reaches the upper limit value, the state value ST and the time digital value TD are reset to 0.

Figures 12, 13, 14:
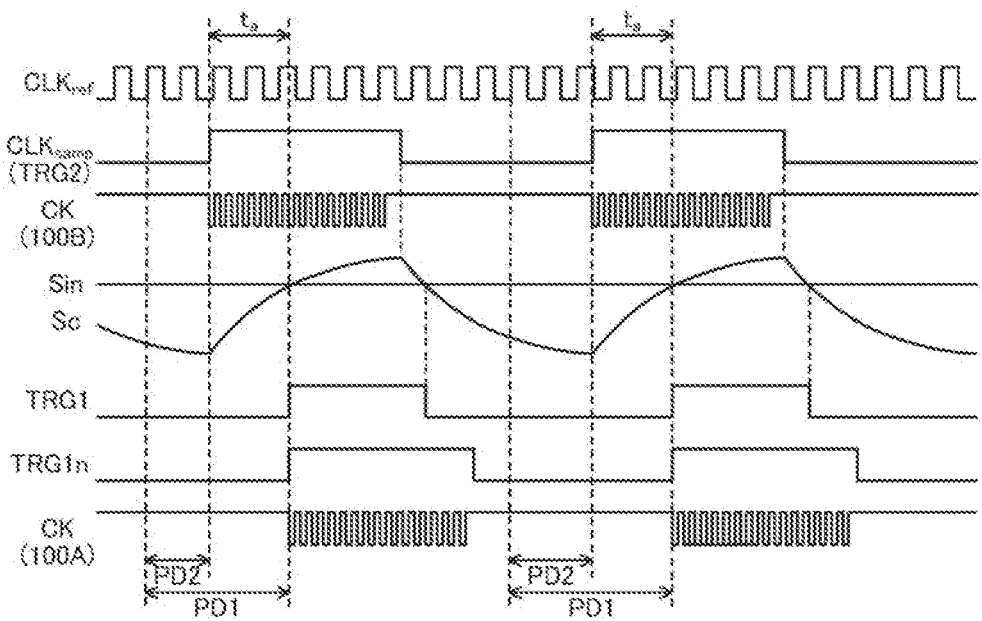
FIG. 12 is a diagram showing a relation between a phase difference and a state value and a time digital value.
FIG. 13 is a diagram showing a relation between the phase value and the time digital value.
FIG. 14 is a timing chart showing an example of operation timing of the A/D conversion circuit in the first embodiment.

FIG. 12 is a diagram showing a relation between the phase difference PD and the state value ST and the time digital value TD. In FIG. 12, the upper limit value of the state value ST is 64. As shown in FIG. 12, every time the time event of the reference clock signal $CLK_{ref}$ occurs, the state value ST is accumulated and the time digital value TD increases. When the time event of the reference clock signal $CLK_{ref}$ is set to a zero-th rising edge, the state value ST reaches 64, which is the upper limit value, at a ninth rising edge when the phase difference PD is T×0.5 and T×0.7. The state value ST reaches 64, which is the upper limit value, respectively at tenth, eleventh, and twelfth rising edges when the phase difference PD is T×1.7, T×2.7, and T×3.7.

FIG. 13 is a diagram showing a relation between the phase difference PD and the time digital value TD obtained at a twelfth rising edge after the state value ST reaches the upper limit value in FIG. 12. The time digital values TD at the time when the phase difference PD is T×0.5, T×0.7, T×1.7, T×2.7, and T×3.7 are respectively 519, 505, 441, 377, and 313. Difference values ΔTD of the time digital values TD are respectively −14, −64, −64, and −64. That is, since the state value ST reaches 64, which is the upper limit value, later as the phase difference PD is larger, the time digital value TD is a smaller value. When the phase difference PD increases by the time T of one cycle of the reference clock signal $CLK_{ref}$, the time digital value TD decreases by 64, which is the upper limit value of the state value ST.

1-4. Arithmetic Operation of the Digital-Signal Generator Section

An example of an arithmetic operation for the digital-signal generator section 40 to generate the digital signal DO is explained below with reference to FIG. 14. FIG. 14 is a timing chart showing an example of operation timing of the A/D conversion circuit 1 in the first embodiment.

As shown in FIG. 14, a voltage of the comparison reference signal Sc increases at a time constant determined by a product RC of a resistance value R of the resistor 11 and a capacitance value C of the capacitor 12 in synchronization with rising of the sampling clock signal $CLK_{samp}$.

Therefore, when an elapsed time from a rising edge of the sampling clock signal $CLK_{samp}$ is represented as t, a voltage $V_c$ of the comparison reference signal Sc in a period in which the sampling clock signal $CLK_{samp}$ is at the high level is represented by Expression (5). In Expression (5), a reference voltage $V_{ref}$ is, for example, a maximum voltage of the voltage $V_c$.

$$V_c = V_{ref}\left\{1 - \exp\left(-\frac{t}{RC}\right)\right\} \quad (5)$$

As shown in FIG. 14, when the voltage $V_c$ of the comparison reference signal Sc crosses a voltage $V_{in}$ of the input signal Sin at an elapsed time $t_a$ from the rising edge of the sampling clock signal $CLK_{samp}$, the voltage $V_{in}$ is represented by Expression (6).

$$V_{in} = V_{ref}\left\{1 - \exp\left(-\frac{t_a}{RC}\right)\right\} \quad (6)$$

In Expression (6), since the reference voltage $V_{ref}$, the resistance value R of the resistor 11, and the capacitance value C of the capacitor 12 are known, digital values of the reference voltage $V_{ref}$, the resistance value R, and the capacitance value C are also known. If a digital value of the elapsed time $t_a$ is calculated, a digital value of the voltage $V_{in}$ of the input signal Sin is calculated.

As shown in FIG. 14, the trigger signal TRG1 is at the high level when the voltage $V_{in}$ of the input signal Sin is lower than the voltage $V_c$ of the comparison reference signal Sc. A rising edge of the trigger signal TRG1n occurs at substantially the same timing as a rising edge of the trigger signal TRG1. As explained above, the time to digital converter 100A generates p pulses of the clock signal CK in a period in which the trigger signal TRG1n is at the high level and generates the time digital value TD1 corresponding to the phase difference PD1 between the time event serving as the reference of the reference clock signal $CLK_{ref}$ and the time event of the trigger signal TRG1.

As shown in FIG. 14, the trigger signal TRG2 is the sampling clock signal $CLK_{samp}$ itself. As explained above, the time to digital converter 100B generates p pulses of the clock signal CK in the period in which the trigger signal TRG2 is at the high level and generates the time digital value TD2 corresponding to the phase difference PD2 between the time event serving as the reference of the reference clock signal $CLK_{ref}$ and the time event of the trigger signal TRG2.

In the example shown in FIG. 14, a time required from when the state transition sections 110 of the time to digital converters 100A and 100B start the state transition until when the time digital values TD1 and TD2 are obtained is set to not exceed a time of a half cycle of the sampling clock signal $CLK_{samp}$. By setting the time in this way, even when the time to digital converters 100A and 100B continuously generate the time digital values TD1 and TD2, the state transition sections 110 can end the present state transition before starting the next state transition.

As shown in FIG. 14, since the elapsed time $t_a$ is equal to a difference between the phase difference PD1 and the phase difference PD2, a difference between the time digital value TD1 and the time digital value TD2 is a time digital value corresponding to the elapsed time $t_a$. Therefore, the digital-signal generator section 40 can calculate a time digital value corresponding to the elapsed time $t_a$ based on the time digital value TD1 and the time digital value TD2. The digital-signal generator section 40 can calculate a digital value of the voltage $V_{in}$ of the input signal Sin using the time digital value corresponding to the elapsed time $t_a$ and generate the digital signal DO having the digital value.

To calculate the elapsed time $t_a$, the time constant RC in Expression (6) needs to be known. However, for example, the elapsed time $t_a$ can be calculated from the time digital values TD1 and TD2 obtained using the input signal Sin, the voltage $V_{in}$ of which is known. The time constant RC can be calculated in advance from the elapsed time $t_a$.

Offset values OF1 and OF2 due to delays or the like by wires at the time when the trigger signals TRG1 and TRG2 are propagated to the time to digital converters 100A and 100B are respectively superimposed on the time digital values TD1 and TD2. The offset values OF1 and OF2 can be calculated in advance from differences between the time digital values TD1 and TD2 obtained using the input signal Sin, the voltage $V_{in}$ of which is known, and theoretical values. The digital-signal generator section 40 may subtract the offset value OF1 from the time digital value TD1, subtract the offset value OF2 from the time digital value TD2, and generate the digital signal DO based on the time digital value TD1, from which the offset value OF1 is subtracted, and the time digital value TD2, from which the offset value OF2 is subtracted. Consequently, an A/D conversion error due to the offset values OF1 and OF2 superimposed on the time digital values TD1 and TD2 is reduced. A/D conversion accuracy is improved.

1-5. Action Effects

As explained above, in the A/D conversion circuit 1 in the first embodiment, the comparison-reference-signal generator section 10 generates the comparison reference signal Sc, which has the specific waveform, synchronized with the sampling clock signal $CLK_{samp}$ and the comparator 20 compares the voltage $V_{in}$ of the input signal Sin and the voltage $V_c$ of the comparison reference signal Sc to thereby generate the trigger signal TRG1. Therefore, generation timing of the trigger signal TRG1 with respect to the sampling clock signal $CLK_{samp}$ changes according to a voltage of the voltage $V_{in}$ of the input signal Sin. On the other hand, since the trigger signal TRG2 is a signal based on the sampling clock $CLK_{samp}$, the generation timing of the trigger signal TRG2 with respect to the sampling clock signal $CLK_{samp}$ is fixed irrespective of the voltage $V_{in}$ of the input signal Sin. Therefore, a phase difference between the trigger signal TRG1 and the trigger signal TRG2 changes according to the voltage of the voltage $V_{in}$ of the input signal Sin.

The time to digital converter 100A calculates the time digital value TD1 corresponding to the phase difference PD1 between the reference clock signal $CLK_{ref}$ and the trigger signal TRG1. The time to digital converter 100B calculates the time digital value TD2 corresponding to the phase difference PD2 between the reference clock signal $CLK_{ref}$ and the trigger signal TRG2. Therefore, a difference between the time digital value TD1 and the time digital value TD2 is a phase difference between the trigger signal TRG1 and the trigger signal TRG2, that is, a value corresponding to the voltage $V_{in}$ of the input signal Sin. The digital-signal generator section 40 can generate, based on the time digital values TD1 and TD2, the digital signal DO corresponding to the voltage $V_{in}$ of the input signal Sin.

In the time to digital converters 100A and 100B, the state transition sections 110 start transition of a state based on the trigger signals TRG1 and TRG2 and output the state value ST. The weight operation section 120 performs, on a value based on the state value ST, weighting corresponding to time elapsing and performs a predetermined arithmetic operation in synchronization with the reference clock signal $CLK_{ref}$ to thereby calculate the time digital values TD1 and TD2 corresponding to the number of transition times of the state of the state transition section 110. Consequently, a noise shaping effect is exerted. Noise components due to fluctuation or the like of delay amounts of the elements configuring the A/D conversion circuit 1 shift to a high-frequency band. The time digital values TD1 and TD2 with a high S/N ratio can be obtained.

In this way, with the A/D conversion circuit 1 in the first embodiment, by using the time to digital converters 100A and 100B, the time digital values TD1 and TD2 with the high S/N ratio can be obtained. Therefore, A/D conversion can be highly accurately performed even if the circuit is not complicated.

2. Second Embodiment

Concerning an A/D conversion circuit in a second embodiment, the same components as the components in the first embodiment are denoted by the same reference numerals and signs and explanation of the components is omitted or simplified. Differences from the first embodiment are mainly explained below.

Figure 15:
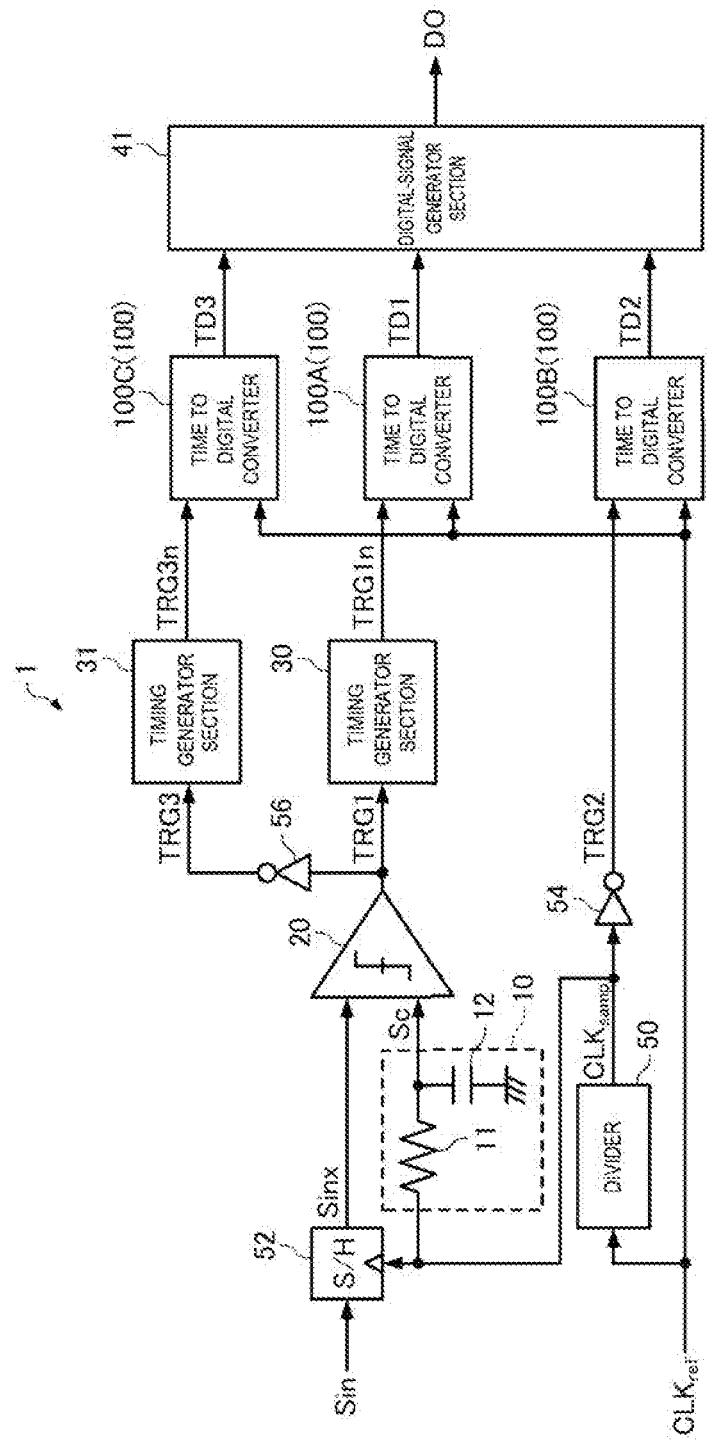
FIG. 15 is a diagram showing the configuration of an A/D conversion circuit in a second embodiment.

FIG. 15 is a diagram showing the configuration of the A/D conversion circuit in the second embodiment. As shown in FIG. 15, the A/D conversion circuit 1 in the second embodiment includes the comparison-reference-signal generator section 10, the comparator 20, timing generator sections 30 and 31, a digital-signal generator section 41, a divider circuit 50, a sample hold circuit 52, logic inversion circuits 54 and 56, and time to digital converters 100A, 100B, and 100C.

The divider circuit 50 divides the reference clock signal $CLK_{ref}$ to generate the sampling clock signal $CLK_{samp}$. Therefore, in this embodiment, the sampling clock signal $CLK_{samp}$ is synchronized with the reference clock signal $CLK_{ref}$.

The logic inversion circuit 54 outputs the trigger signal TRG2 obtained by inverting a logical level of the sampling clock signal $CLK_{samp}$. Therefore, when the logical level of the sampling clock signal $CLK_{samp}$ changes, a logical level of the trigger signal TRG2 also changes. Therefore, the trigger signal TRG2 is a signal synchronized with the sampling clock signal $CLK_{samp}$.

The sample hold circuit 52 samples and holds the input signal Sin based on the sampling clock signal $CLK_{samp}$ and outputs a hold signal Sinx.

The comparison-reference-signal generator section 10 generates the comparison reference signal Sc, which has a specific waveform, synchronized with the sampling clock signal $CLK_{samp}$. In the second embodiment, as in the first embodiment, the comparison-reference-signal generator section 10 includes the resistor 11 and the capacitor 12 configuring an integrator circuit that integrates the sampling clock signal $CLK_{samp}$. The comparison-reference-signal generator section 10 generates the comparison reference signal Sc based on an output signal of the integrator circuit. A division ratio of the divider circuit 50 is set as appropriate according to a time constant of the integrator circuit.

The comparator 20 compares a voltage of the hold signal Sinx, which is the input signal Sin held by the sample hold circuit 52, and a voltage of the comparison reference signal Sc to thereby generate the trigger signal TRG1.

The timing generator section 30 generates, based on the trigger signal TRG1, the trigger signal TRG1n to indicate operation timing of the time to digital converter 100A.

The logic inversion circuit 56 outputs a trigger signal TRG3 obtained by inverting a logical level of the trigger signal TRG1. Therefore, when the logical level of the trigger signal TRG1 changes, a logical level of the trigger signal TRG3 also changes. Therefore, the trigger signal TRG3 is a signal synchronized with the trigger signal TRG1.

The timing generator section 31 generates, based on the trigger signal TRG3, a trigger signal TRG3n to indicate operation timing of the time to digital converter 100C.

The reference clock signal $CLK_{ref}$ and the trigger signal TRG1n are input to the time to digital converter 100A. The time to digital converter 100A calculates the time digital value TD1 corresponding to a phase difference between the reference clock signal $CLK_{ref}$ and the trigger signal TRG1n. Specifically, the time to digital converter 100A calculates the time digital value TD1 corresponding to the phase difference PD1 between the time event serving as the reference of the reference clock signal $CLK_{ref}$ and a time event of the trigger signal TRG1n.

The reference clock signal $CLK_{ref}$ and the trigger signal TRG2 are input to the time to digital converter 100B. The time to digital converter 100B calculates the time digital value TD2 corresponding to a phase difference between the reference clock signal $CLK_{ref}$ and the trigger signal TRG2. Specifically, the time to digital converter 100B calculates the time digital value TD2 corresponding to the phase difference PD2 between the time event serving as the reference of the reference clock signal $CLK_{ref}$ and a time event of the trigger signal TRG2.

The reference clock signal $CLK_{ref}$ and the trigger signal TRG3n are input to the time to digital converter 100C. The time to digital converter 100C calculates a time digital value TD3 corresponding to a phase difference between the reference clock signal $CLK_{ref}$ and the trigger signal TRG3n. Specifically, the time to digital converter 100C calculates the time digital value TD3 corresponding to a phase difference PD3 between the time event serving as the reference of the reference clock signal $CLK_{ref}$ and a time event of the trigger signal TRG3n.

In this embodiment, the time event of the trigger signal TRG3n is substantially the same timing as the time event of the trigger signal TRG3. For example, when the time event of the trigger signal TRG3n is a rising edge and the time event of the trigger signal TRG3 is a rising edge, the rising edge of the trigger signal TRG3n is substantially the same timing as the rising edge of the trigger signal TRG3. Therefore, the time to digital converter 100A is considered to calculate the time digital value TD3 corresponding to the phase difference PD3 between the reference clock signal $CLK_{ref}$ and the trigger signal TRG3.

The digital-signal generator section 41 generates, based on the time digital value TD1, the time digital value TD2, and the time digital value TD3, the digital signal DO corresponding to a voltage of the input signal Sin.

In FIG. 15, the trigger signal TRG1 is equivalent to the "first trigger signal", the trigger signal TRG2 is equivalent to the "second trigger signal", and the trigger signal TRG3 is equivalent to a "third trigger signal". The time digital value TD1 is equivalent to the "first time digital value", the time digital value TD2 is equivalent to the "second time digital value", and the time digital value TD3 is equivalent to a "third time digital value". The time to digital converter 100A is equivalent to the "first time to digital converter", the time to digital converter 100B is equivalent to the "second time to digital converter", and the time to digital converter 100C is equivalent to a "third time to digital converter".

In this embodiment, the time to digital converter 100A, the time to digital converter 100B, and the time to digital converter 100C have the same configuration. Signals input to the time to digital converter 100A, the time to digital converter 100B, and the time to digital converter 100C are different. The configuration and the operation of the time to digital converter 100, which is the time to digital converter 100A, the time to digital converter 100B, or the time to digital converter 100C, are as explained with reference to FIGS. 2 to 13 above.

The state transition section 110 of the time to digital converter 100A is equivalent to the "first state transition section", the state transition section 110 of the time to digital converter 100B is equivalent to the "second state transition section", and the state transition section 110 of the time to digital converter 100C is equivalent to a "third state transition section". The state value ST output from the state transition section 110 of the time to digital converter 100A is equivalent to the "first state information", the state value ST output from the state transition section 110 of the time to digital converter 100B is equivalent to the "second state information", and the state value ST output from the state transition section 110 of the time to digital converter 100C is equivalent to "third state information". The weight operation section 120 of the time to digital converter 100A is equivalent to the "first weight operation section", the weighed operation section 120 of the time to digital converter 100B is equivalent to the "second weight operation section", and the weight operation section 120 of the time to digital converter 100C is equivalent to a "third weight operation section".

Figure 16:
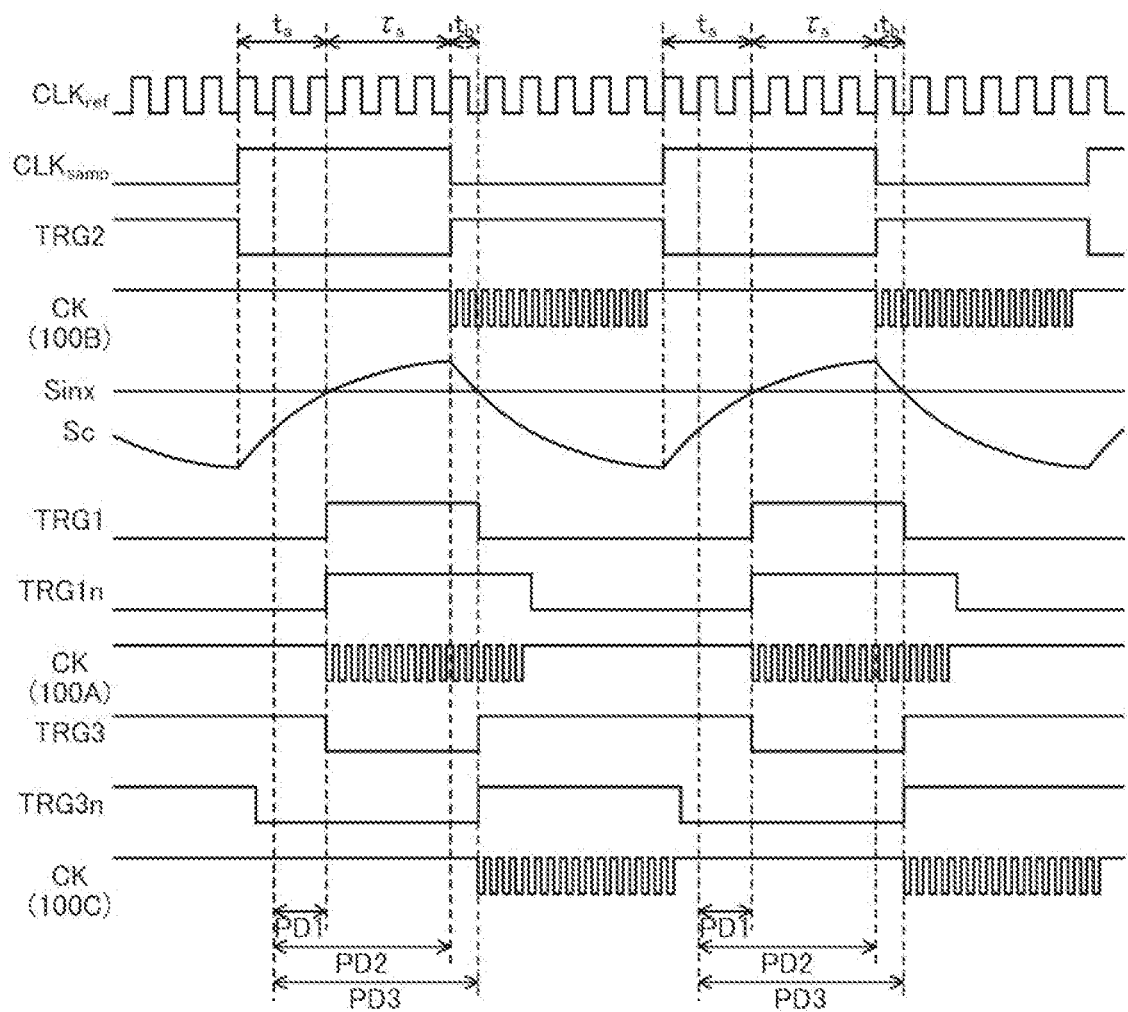
FIG. 16 is a timing chart showing an example of operation timing of the A/D conversion circuit in the second embodiment.

FIG. 16 is a timing chart showing an example of operation timing of the A/D conversion circuit 1 in the second embodiment.

As shown in FIG. 16, a voltage of the comparison reference signal Sc increases or decreases at the time constant RC determined by the product RC of the resistance value R of the resistor 11 and the capacitance value C of the capacitor 12 in synchronization with rising or falling of the sampling clock signal $CLK_{samp}$.

Therefore, when an elapsed time after logic inversion of the sampling clock signal $CLK_{samp}$ is represented as t, the voltage $V_c$ of the comparison reference signal Sc in a period in which the sampling clock signal $CLK_{samp}$ is at the high level is represented by Expression (5). The voltage $V_c$ of the comparison reference signal Sc in a period in which the sampling clock signal $CLK_{samp}$ is at the low level is represented by Expression (7).

$$V_c = V_{ref} \cdot \exp\left(-\frac{t}{RC}\right) \qquad (7)$$

As shown in FIG. 16, when the voltage $V_c$ of the comparison reference signal Sc crosses the voltage $V_{in}$ of the hold signal Sinx at the elapsed time $t_a$ from the rising edge of the sampling clock signal $CLK_{samp}$, the voltage $V_{in}$ is represented by Expression (6) described above. When the voltage $V_c$ of the comparison reference signal Sc crosses the voltage $V_{in}$ of the hold signal Sinx at an elapsed time $t_b$ from the falling edge of the sampling clock signal $CLK_{samp}$, the voltage $V_{in}$ is represented by Expression (8).

$$V_{in} = V_{ref} \cdot \exp\left(-\frac{t_b}{RC}\right) \qquad (8)$$

In Expression (6) and Expression (8), if the reference voltage $V_{ref}$ is known and the time constant RC is known, digital values of the reference voltage $V_{ref}$ and the time constant RC are also known. If a digital value of the elapsed time $t_a$ and a digital value of the elapsed time $t_b$ are calculated, a digital value of the voltage $V_{in}$ of the hold signal Sinx is calculated. For example, an average of the digital value of the average $V_{in}$ of the hold signal Sinx calculated from Expression (6) and the digital value of the voltage $V_{in}$ of the hold signal Sinx calculated from Expression (8) may be set as the voltage of the input signal Sin.

Since the likelihood of the voltage $V_{in}$ of the hold signal Sinx is not fixed, a correlation is considered to be present between the absolute value of a tilt of the voltage $V_c$ of the comparison reference signal Sc at the elapsed times ta and tb and the likelihood of the voltage $V_{in}$ of the hold signal Sinx calculated from Expression (6) and Expression (8). For example, when it is assumed that the likelihood of the voltage $V_{in}$ of the hold signal Sinx is higher as the absolute value of the tilt of the voltage $V_c$ of the comparison reference signal Sc is smaller, the digital value of the voltage $V_{in}$ of the hold signal Sinx calculated from Expression (6) may be set as the digital value of the voltage of the input signal Sin when the absolute value of the tilt of the voltage $V_c$ at the elapsed time $t_a$ is smaller than the absolute value of the tilt of the voltage $V_c$ at the elapsed time $t_b$ and the digital value of the voltage $V_{in}$ of the hold signal Sinx calculated from Expression (8) may be set as the digital value of the voltage of the input signal Sin when the absolute value of the tilt of the voltage $V_c$ at the elapsed time $t_b$ is smaller than the absolute value of the tilt of the voltage $V_c$ at the elapsed time $t_a$.

Alternatively, the digital value of the voltage of the input signal Sin may be calculated as follows. When both sides of Expression (5) are differentiated by the time t, a tilt of the voltage $V_c$ of the comparison reference signal Sc in a period in which the sampling clock signal $CLK_{samp}$ is at the high level is calculated by Expression (9). Similarly, when both the sides of Expression (7) are differentiated by the time t, a tilt of the voltage $V_c$ of the comparison reference signal Sc in a period in which the sampling clock signal $CLK_{samp}$ is at the low level is calculated by Expression (10).

$$\dot{V}_c = \frac{V_{ref}}{RC} \cdot \exp\left(-\frac{t}{RC}\right) \quad (9)$$

$$\dot{V}_c = -\frac{V_{ref}}{RC} \cdot \exp\left(-\frac{t}{RC}\right) \quad (10)$$

A weighted average of the digital value of the voltage Vin, weighted by the absolute value of the slope of the voltage VC of the comparison reference signal Sc, is obtained by Expression (11).

$$\overline{V}_{in} = \frac{|\dot{V}_c(t=t_a)| \cdot V_{in}(t=t_a) + |\dot{V}_c(t=t_b)| \cdot V_{in}(t=t_b)}{|\dot{V}_c(t=t_a)| + |\dot{V}_c(t=t_b)|} \quad (11)$$

When Expression (9) and Expression (10) are substituted in Expression (11) and arranged, Expression (12) is obtained.

$$\overline{V}_{in} = \frac{1 - \exp\left(-\frac{t_a}{RC}\right) + \exp\left(\frac{t_a - 2t_b}{RC}\right)}{1 + \exp\left(\frac{t_a - t_b}{RC}\right)} \cdot V_{ref} \quad (12)$$

The weighted average calculated by Expression (12) may be set as the digital value of the voltage of the input signal Sin.

As shown in FIG. 16, the trigger signal TRG1 is at the high level when the voltage $V_{in}$ of the hold signal Sinx is lower than the voltage $V_c$ of the comparison reference signal Sc. A rising edge of the trigger signal TRG1n occurs at substantially the same timing as a rising edge of the trigger signal TRG1. The time to digital converter 100A generates p pulses of the clock signal CK in a period in which the trigger signal TRG1n is at the high level and generates the time digital value TD1 corresponding to the phase difference PD1 between the time event serving as the reference of the reference clock signal $CLK_{ref}$ and the time event of the trigger signal TRG1.

As shown in FIG. 16, the trigger signal TRG2 is a logic inverted signal of the sampling clock signal $CLK_{samp}$. The time to digital converter 100B generates p pulses of the clock signal CK in the period in which the trigger signal TRG2 is at the high level and generates the time digital value TD2 corresponding to the phase difference PD2 between the time event serving as the reference of the reference clock signal $CLK_{ref}$ and the time event of the trigger signal TRG2.

As shown in FIG. 16, the trigger signal TRG3 is a logic inverted signal of the trigger signal TRG1. A rising edge of the trigger signal TRG3n occurs at substantially the same timing as a rising edge of the trigger signal TRG3. The time to digital converter 100C generates p pulses of the clock signal CK in a period in which the trigger signal TRG3n is at the high level and generates the time digital value TD3 corresponding to the phase difference PD3 between the time event serving as the reference of the reference clock signal $CLK_{ref}$ and the time event of the trigger signal TRG3.

In the example shown in FIG. 16, a time required from when the state transition sections 110 of the time to digital converters 100A, 100B, and 100C start the state transition until when the time digital values TD1, TD2, and TD3 are obtained is set to not exceed a time of a half cycle of the sampling clock signal $CLK_{samp}$. By setting the time in this way, even when the time to digital converters 100A, 100B, and 100C respectively continuously generate the time digital values TD1, TD2, and TD3, the state transition sections 110 can end the present state transition before starting the next state transition.

As shown in FIG. 16, a difference between the time digital value TD2 and the time digital value TD1 is a time digital value corresponding to a time $\tau_a$ equivalent to a difference between the phase PD2 and the phase PD1. A time of one cycle of the sampling clock signal $CLK_{samp}$ is known and the elapsed time $t_a$ is equal to a time obtained by subtracting the time $\tau_a$ from a time of a half cycle of the sampling clock signal $CLK_{samp}$. Therefore, a time digital value corresponding to the elapsed time $t_a$ is calculated. Since the elapsed time $t_b$ is equal to a difference between the phase difference PD3 and the phase difference PD2, a difference between the time digital value TD3 and the time digital value TD2 is a time digital value corresponding to the elapsed time $t_b$. Therefore, the digital-signal generator section 41 can calculate time digital values corresponding to the elapsed times $t_a$ and $t_b$ based on the time digital value TD1, the time digital value TD2, and the time digital value TD3. The digital-signal generator section 41 can calculate a digital value of a voltage of the input signal Sin using the time digital values corresponding to the elapsed times $t_a$ and $t_b$ and generate the digital signal DO having the digital value.

To calculate the elapsed times $t_a$ and $t_b$, the time constant RC in Expression (6) and Expression (8) needs to be known. However, for example, the elapsed times $t_a$ and $t_b$ can be calculated from the time digital values TD1, TD2, and TD3 obtained using the input signal Sin, the voltage $V_{in}$ of which is known. The time constant RC can be calculated in advance from the elapsed times $t_a$ and $t_b$.

Offset values OF1, OF2, and OF3 due to delays or the like by wires at the time when the trigger signals TRG1, TRG2, and TRG3 are propagated to the time to digital converters 100A, 100B, and 100C are respectively superimposed on the time digital values TD1, TD2, and TD3. The offset values OF1, OF2, and OF3 can be calculated in advance from differences between the time digital values TD1, TD2, and TD3 obtained using the input signal Sin, the voltage $V_{in}$ of which is known, and theoretical values. The digital-signal generator section 41 may subtract the offset value OF1 from the time digital value TD1, subtract the offset value OF2 from the time digital value TD2, subtract the offset value OF3 from the time digital value TD3, and generate the digital signal DO based on the time digital value TD1, from which the offset value OF1 is subtracted, the time digital value TD2, from which the offset value OF2 is subtracted, and the time digital value TD3, from which the offset value OF3 is subtracted. Consequently, an A/D conversion error due to the offset values OF1, OF2, and OF3 superimposed on the time digital values TD1, TD2, and TD3 is reduced. A/D conversion accuracy is improved.

When the time constant RC of the integrator circuit configured by the resistor 11 and the capacitor 12 fluctuates because of a temperature change, aged deterioration, or the like, the elapsed time $t_a$ and $t_b$ also fluctuate according to the fluctuation of the time constant RC, causing deterioration in the A/D conversion efficiency. Therefore, in this embodiment, the fluctuation of the time constant RC is compensated as follows making use of the fact that the voltage $V_{in}$ of the hold signal Sinx does not change during the measurement of the elapsed times $t_a$ and $t_b$ because the input signal Sin is held by the sample hold circuit 52.

First, as preparation, the Taylor expansion of a function $f(x)=\exp(-t/x)$ is considered. The Taylor expansion around RC of f(x) is given by Expression (13).

$$f(x) = f(RC) + f'(RC)(x - RC) + \frac{1}{2!} f''(RC)(x - RC)^2 + \cdots \quad (13)$$

When Taylor expansion to a first order of Expression (13) is considered, since $f'(x) \sim t/x^2 \cdot \exp(-t/x)$, Expression (14) is derived.

$$\exp\left(-\frac{t}{x}\right) \sim \exp\left(-\frac{t}{RC}\right) + \frac{t}{R^2C^2} \cdot \exp\left(-\frac{t}{RC}\right)(x - RC) = \exp\left(-\frac{t}{RC}\right) \cdot \left\{1 + \frac{t}{R^2C^2}(x - RC)\right\} \quad (14)$$

When it is assumed that RC changes by $\varepsilon$ to $R'C'=RC+\varepsilon$ and Expression (6) and Expression (8) are equal, Expression (15) is obtained.

$$\exp\left(-\frac{t_a}{R'C'}\right) + \exp\left(-\frac{t_b}{R'C'}\right) = 1 \quad (15)$$

When the exp terms of Expression (15) are Taylor expanded by using Expression (14), Expression (16) is obtained.

$$\exp\left(-\frac{t_a}{RC}\right)\left\{1 + \frac{t_a}{R^2C^2} \cdot \varepsilon\right\} + \exp\left(-\frac{t_b}{RC}\right)\left\{1 + \frac{t_b}{R^2C^2} \cdot \varepsilon\right\} = 1 \quad (16)$$

When Expression (16) is solved about the fluctuation amount $\varepsilon$, Expression (17) is obtained.

$$\varepsilon = \frac{R^2C^2\left\{1 - \exp\left(-\frac{t_a}{RC}\right) - \exp\left(-\frac{t_b}{RC}\right)\right\}}{t_a \exp\left(-\frac{t_a}{RC}\right) + t_b \exp\left(-\frac{t_b}{RC}\right)} \quad (17)$$

In Expression (17), the time constant RC is known. If digital values of the elapsed times ta and tb are calculated, the fluctuation amount $\varepsilon$ is calculated.

As explained above, the digital-signal generator section 41 can calculate time digital values corresponding to the elapsed times $t_a$ and $t_b$ based on the time digital value TD1, the time digital value TD2, and the time digital value TD3. Therefore, the digital-signal generator section may calculate the fluctuation amount $\varepsilon$ of the time constant RC based on the time digital value TD1, the time digital value TD2, and the time digital value TD3 and generate the digital signal DO compensated for the fluctuation amount $\varepsilon$. Consequently, a fluctuation amount of the time constant RC is compensated and the A/D conversion accuracy is improved.

A value of $\varepsilon$ may be sequentially updated online or may be updated offline. The digital-signal generator section 41 may compensate for the fluctuation amount of the time constant RC using a plurality of values of $\varepsilon$ subjected to filter processing or statistical processing. In the example explained above, the Taylor expansion to the first order of Expression (13) is considered. However, the digital-signal generator section 41 may compensate for the fluctuation amount of the time constant RC by considering high-order Taylor expansion of Expression (13).

As explained above, in the A/D conversion circuit in the second embodiment, the sample hold circuit 52 samples and holds the input signal Sin based on the sampling clock signal $CLK_{samp}$, the comparison-reference-signal generator section 10 generates the comparison reference signal Sc, which has the specific waveform, synchronized with the sampling clock signal $CLK_{samp}$, and the comparator 20 compares the voltage $V_{in}$ of the hold signal Sinx and the voltage $V_c$ of the comparison reference signal Sc to thereby generate the trigger signal TRG1. The trigger signal TRG3 is synchronized with the trigger signal TRG1. Therefore, generation timing of the trigger signals TRG1 and TRG3 with respect to the sampling clock signal $CLK_{samp}$ changes according to a voltage of the voltage $V_{in}$ of the hold signal Sinx. On the other hand, since the trigger signal TRG2 is a signal based on the sampling clock signal $CLK_{samp}$, generation timing of the trigger signal TRG2 with respect to the sampling clock signal $CLK_{samp}$ is fixed irrespective of the voltage of the voltage $V_{in}$ of the hold signal Sinx. Therefore, a phase difference between the trigger signals TRG1 and TRG3 and the trigger signal TRG2 changes according to the voltage of the voltage $V_{in}$ of the hold signal Sinx.

The time to digital converter 100A calculates the time digital value TD1 corresponding to the phase difference PD1 between the reference clock signal $CLK_{ref}$ and the trigger signal TRG1. The time to digital converter 100B calculates the time digital value TD2 corresponding to the phase difference PD2 between the reference clock signal $CLK_{ref}$ and the trigger signal TRG2. The time to digital converter 100C calculates the time digital value TD3 corresponding to the phase difference PD3 between the reference clock signal $CLK_{ref}$ and the trigger signal TRG3. Therefore, a difference between the time digital value TD1 and the time digital value TD2 is a phase difference between the trigger signal TRG1 and the trigger signal TRG2, that is, a value corresponding to the voltage of the voltage $V_{in}$ of the hold signal Sinx. A difference between the time digital value TD3 and the time digital value TD2 is a phase difference between the trigger signal TRG3 and the trigger signal TRG2, that is, a value corresponding to the voltage of the voltage $V_{in}$ of the hold signal Sinx. Therefore, the digital-signal generator section 41 can generate, based on the time digital values TD1, TD2, and TD3, the digital signal DO corresponding to the voltage $V_{in}$ of the hold signal Sinx.

In the time to digital converters 100A, 100B, and 100C, the state transition sections 110 start transition of a state based on the trigger signals TRG1, TRG2, and TRG3 and output the state value ST. The weight operation sections 120 perform, on a value based on the state value ST, weighting corresponding to time elapsing and perform a predetermined arithmetic operation in synchronization with the reference clock signal $CLK_{ref}$ to thereby calculate the time digital values TD1, TD2, and TD3 corresponding to the numbers of times of transition of the state of the state transition sections 110. Consequently, a noise shaping effect is exerted. Noise components due to fluctuation or the like of delay amounts of the elements configuring the A/D conversion circuit 1 shift to a high-frequency band. The time digital values TD1, TD2, and TD3 with a high S/N ratio can be obtained.

As explained above, with the A/D conversion circuit 1 in the second embodiment, the digital values TD1, TD2, and TD3 with a high S/N ratio can be obtained by using the time to digital converters 100A, 100B, and 100C. Therefore, it is possible to highly accurately perform A/D conversion even if the circuit is not complicated.

In the A/D conversion circuit 1 in the second embodiment, the sample hold circuit 52 samples and holds the input signal Sin based on the sampling clock signal $CLK_{samp}$. The digital signal DO based on the hold signal Sinx is obtained. Therefore, with the A/D conversion circuit 1 in the second embodiment, since the voltage of the hold signal Sinx is fixed even if the voltage of the input signal Sin fluctuates, fluctuation in sampling timing corresponding to the voltage of the input signal Sin is reduced. The A/D conversion can be highly accurately performed.

In the A/D conversion circuit 1 in the second embodiment, since the divider circuit 50 divides the reference clock signal $CLK_{ref}$ to generate the sampling clock signal $CLK_{samp}$, the sampling clock signal $CLK_{samp}$ is synchronized with the reference clock signal $CLK_{ref}$. Therefore, assuming that a phase difference between the reference clock signal $CLK_{ref}$ and the sampling clock signal $CLK_{samp}$ is fixed and the time digital value TD2 corresponding to the phase difference PD2 is a known fixed value, the logic inversion circuit 54 and the time to digital converter 100B may be omitted. Consequently, it is possible to reduce the size of the A/D conversion circuit 1.

3. Third Embodiment

Concerning an A/D conversion circuit in a third embodiment, the same components as the components in the first embodiment or the second embodiment are denoted by the same reference numerals and signs and explanation of the components is omitted or simplified. Differences from the first embodiment and the second embodiment are mainly explained below.

Figure 17:
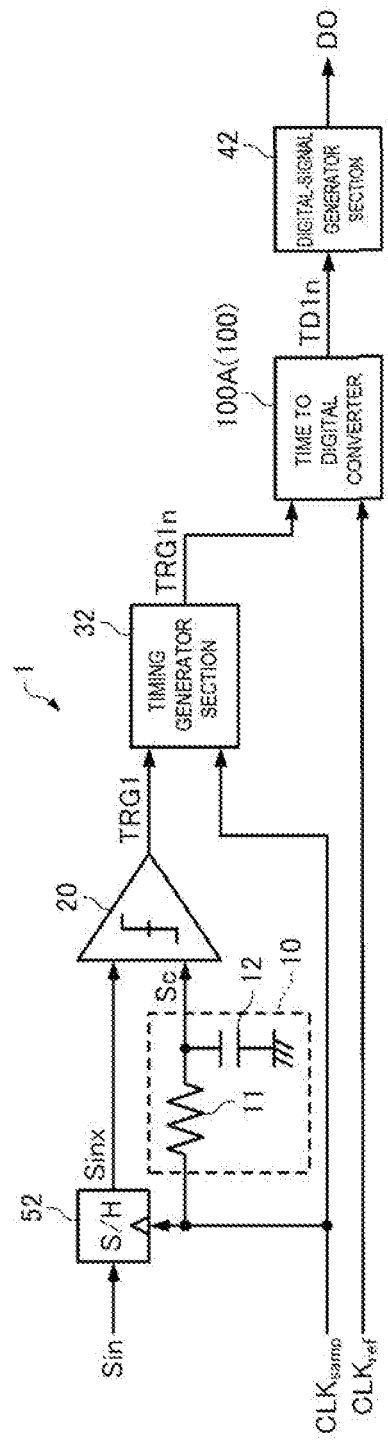
FIG. 17 is a diagram showing the configuration of an A/D conversion circuit in a third embodiment.

FIG. 17 is a diagram showing the configuration of the A/D conversion circuit in the third embodiment. As shown in FIG. 17, the A/D conversion circuit 1 in the third embodiment includes the comparison-reference-signal generator section 10, the comparator 20, a timing generator section 32, a digital-signal generator section 42, the sample hold circuit 52, and the time to digital converter 100A.

The sample hold circuit 52 samples and holds the input signal Sin based on the sampling clock signal $CLK_{samp}$ and outputs the hold signal Sinx.

The comparison-reference-signal generator section 10 generates the comparison reference signal Sc, which has a specific waveform, synchronized with the sampling clock signal $CLK_{samp}$. In the third embodiment, as in the first embodiment and the second embodiment, the comparison-reference-signal generator section 10 includes the resistor 11 and the capacitor 12 configuring an integrator circuit that integrates the sampling clock signal $CLK_{samp}$. The comparison-reference-signal generator section 10 generates the comparison reference signal Sc based on an output signal of the integrator circuit.

The comparator 20 compares a voltage of the hold signal Sinx, which is the input signal Sin held by the sample hold circuit 52, and a voltage of the comparison reference signal Sc to thereby generate the trigger signal TRG1.

The timing generator section 32 generates, based on the trigger signal TRG1 and the sampling clock signal $CLK_{samp}$, the trigger signal TRG1n to indicate operation timing of the time to digital converter 100A. Specifically, the timing generator section 32 generates a time event of the trigger signal TRG1n based on a time event of the trigger signal TRG1 and further generates the next time event of the trigger signal TRG1n based on a time event of the sampling clock signal $CLK_{samp}$.

The reference clock signal $CLK_{ref}$ and the trigger signal TRG1n are input to the time to digital converter 100A. The time to digital converter 100A calculates a time digital value TD1n corresponding to a phase difference between the reference clock signal $CLK_{ref}$ and the trigger signal TRG1n. Specifically, the time to digital converter 100A calculates the time digital value TD1n corresponding to the phase difference PD1 between the time event serving as the reference of the reference clock signal $CLK_{ref}$ and a time event of the trigger signal TRG1n. Further, the time to digital converter 100A calculates the time digital value TD1n corresponding to the phase difference PD2 between the time event serving as the reference of the reference clock signal $CLK_{ref}$ and the next time event of the trigger signal TRG1n.

In this embodiment, a predetermined time event of the trigger signal TRG1n is substantially the same timing as the time event of the trigger signal TRG1. For example, when the time event of the trigger signal TRG1n is a rising edge and the time event of the trigger signal TRG1 is a rising edge, the rising edge of the trigger signal TRG1n is substantially the same timing as the rising edge of the trigger signal TRG1. The next time event of the trigger signal TRG1n is substantially the same timing as the time event of the sampling clock signal $CLK_{samp}$. For example, when the time event of the trigger signal TRG1n is a rising edge and the time event of the sampling clock signal $CLK_{samp}$ is a rising edge, the rising edge of the trigger signal TRG1n is substantially the same timing as the rising edge of the sampling clock signal $CLK_{samp}$. Therefore, the time to digital converter 100A is considered to calculate the time digital value TD1n corresponding to the phase difference PD1 between the reference clock signal $CLK_{ref}$ and the trigger signal TRG1 and further calculate the time digital value TD1n corresponding to the phase difference PD2 between the reference clock signal $CLK_{ref}$ and the sampling clock signal $CLK_{samp}$.

The digital-signal generator section 42 generates, based on the time digital value TD1$n$ corresponding to the phase difference PD1 and the time digital value TD1$n$ corresponding to the phase difference PD2, the digital signal DO corresponding to a voltage of the input signal Sin.

In FIG. 17, the trigger signal TRG1 is equivalent to the "first trigger signal" and the sampling clock signal CLK$_{samp}$ is equivalent to the "second trigger signal". The time digital value TD1$n$ corresponding to the phase difference PD1 is equivalent to the "first time digital value" and the time digital value TD1$n$ corresponding to the phase difference PD2 is equivalent to the "second time digital value". The time to digital converter 100A is equivalent to the "first time to digital converter".

In this embodiment, the configuration and the function of the time to digital converter 100A are as explained with reference to FIGS. 2 to 13 above.

However, in this embodiment, the state transition section 110 starts transition of a state based on the trigger signal TRG1$n$ and outputs a state value ST1 indicating the state and further starts transition of the state based on the trigger signal TRG1$n$ and outputs a state value ST2 indicating the state. Specifically, the state transition section 110 starts transition of a state with a time event of the trigger signal TRG1$n$ and outputs the state value ST1 indicating the state and further starts transition of the state with the next time event of the trigger signal TRG1$n$ and outputs the state value ST2 indicating the next state.

The weight operation section 120 performs, on a value based on the state value ST1, weighting corresponding to time elapsing and performs a predetermined arithmetic operation in synchronization with the reference clock signal CLK$_{ref}$ to thereby calculate the time digital value TD1$n$ corresponding to the number of transition times of the state of the state transition section 110 and further performs, on a value based on the state value ST2, weighting corresponding to time elapsing and performs a predetermined arithmetic operation in synchronization with the reference clock signal CLK$_{ref}$ to thereby calculate the time digital value TD1$n$ corresponding to the number of transition times of the state of the state transition section 110. Specifically, the weight operation section 120 calculates the time digital value TD1$n$ corresponding to the phase difference PD1 based on the state value ST1 and further calculates the time digital value TD1$n$ corresponding to the phase difference PD2 based on the state value ST2.

The state transition section 110 of the time to digital converter 100A is equivalent to the "first state transition section". The state value ST1 output from the state transition section 110 of the time to digital converter 100A is equivalent to the "first state information". The state value ST2 output from the state transition section 110 of the time to digital converter 100B is equivalent to the "second state information". The weight operation section 120 of the time to digital converter 100A is equivalent to the "first weight operation section".

Figure 18:
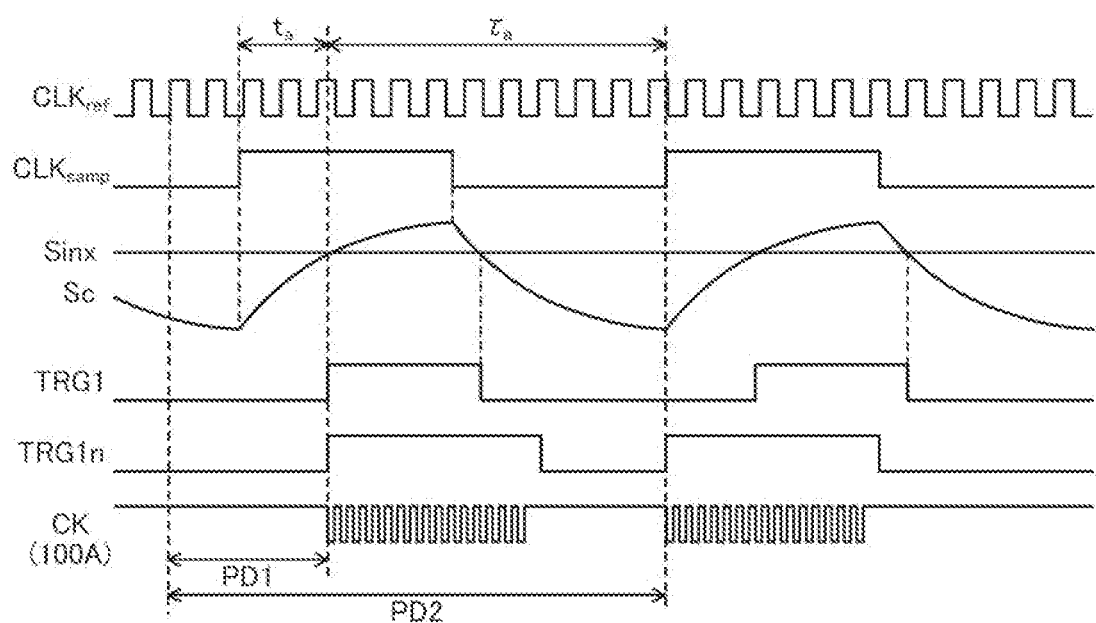
FIG. 18 is a timing chart showing an example of operation timing of the A/D conversion circuit in the third embodiment.

FIG. 18 is a timing chart showing an example of operation timing of the A/D conversion circuit 1 in the third embodiment.

As shown in FIG. 18, a voltage of the comparison reference signal Sc increases at a time constant determined by the product RC of the resistance value R of the resistor and the capacitance value C of the capacitor 12 in synchronization with rising of the sampling clock signal CLK$_{samp}$.

When the voltage V$_c$ of the comparison reference signal Sc crosses the voltage V$_{in}$ of the input signal Sin at the elapsed time t$_a$ from a rising edge of the sampling clock signal CLK$_{samp}$, the voltage V$_{in}$ is represented by Expression (6) described above. In Expression (6), since the reference voltage V$_{ref}$, the resistance value R of the resistor 11, and the capacitance value C of the capacitor 12 are known, digital values of the reference voltage V$_{ref}$, the resistance value R, and the capacitance value C are also known. If a digital value of the elapsed time t$_a$ is calculated, a digital value of the voltage V$_{in}$ of the hold signal Sinx is calculated.

As shown in FIG. 18, the trigger signal TRG1 is at the high level when the voltage V$_{in}$ of the hold signal Sinx is lower than the voltage V$_c$ of the comparison reference signal Sc. A first rising edge of the trigger signal TRG1$n$ occurs at substantially the same timing as a rising edge of the trigger signal TRG1. A second rising edge of the trigger signal TRG1$n$ occurs at substantially the same timing as a rising edge of the sampling clock signal CLK$_{samp}$. The time to digital converter 100A generates p pulses of the clock signal CK in a period in which the trigger signal TRG1$n$ is at the high level and generates the time digital value TD1$n$ corresponding to the phase difference PD1 between the time event serving as the reference of the reference clock signal CLK$_{ref}$ and the time event of the trigger signal TRG1. The time to digital converter 100A generates p pulses of the clock signal CK in a period in which the trigger signal TRG1$n$ is at the high level and generates the time digital value TD1$n$ corresponding to the phase difference PD2 between the time event serving as the reference of the reference clock signal CLK$_{ref}$ and the time event of the sampling clock signal CLK$_{samp}$.

In the example shown in FIG. 18, a time required from when the state transition section 110 of the time to digital converter 100A starts the state transition until when the time digital value TD1$n$ is obtained is set to not exceed a time of a half cycle of the sampling clock signal CLK$_{samp}$. By setting the time in this way, even when the time to digital converter 100A continuously generates the time digital values TD1$n$, the state transition section 110 can end the present state transition before starting the next state transition.

As shown in FIG. 18, a difference between the time digital value TD1$n$ corresponding to the phase difference PD2 and the time digital value TD1$n$ corresponding to the phase difference PD1 is a time digital value corresponding to a time τ$_a$ equivalent to a difference between the phase difference PD2 and the phase difference PD1. Since a time of one cycle of the sampling clock signal CLK$_{samp}$ is known and the elapsed time t$_a$ is equal to a time obtained by subtracting the time τ$_a$ from the time of one cycle of the sampling clock signal CLK$_{samp}$, a time digital value corresponding to the elapsed time t$_a$ is calculated. Therefore, the digital-signal generator section 42 can calculate a time digital value corresponding to the elapsed time t$_a$ based on the time digital value TD1$n$. The digital-signal generator section 42 can calculate a digital value of a voltage of the input signal Sin using the time digital value corresponding to the elapsed time t$_a$ and generate the digital signal DO having the digital value.

To calculate the elapsed time t$_a$, the time constant RC in Expression (6) needs to be known. However, for example, the elapsed time t$_a$ can be calculated from the time digital values TD1 and TD2 obtained using the input signal Sin, the voltage V$_{in}$ of which is known. The time constant RC can be calculated in advance from the elapsed time t$_a$.

The offset values OF1 and OF2 due to a delay or the like by a wire at the time when the trigger signal TRG1 and sampling clock signal CLK$_{samp}$ are propagated to the time to digital converter 100A are respectively superimposed on the time digital values TD1n respectively corresponding to the phase differences PD1 and PD2. The offset values OF1 and OF2 can be calculated in advance from differences between the time digital values TD1n respectively corresponding to the phase differences PD1 and PD2 obtained using the input signal Sin, the voltage $V_{in}$ of which is known, and theoretical values. The digital-signal generator section 42 may subtract the offset value OF1 from the time digital value TD1n corresponding to the phase difference PD1, subtract the offset value OF2 from the time digital value TD1n corresponding to the phase difference PD2, and generate the digital signal DO based on the time digital value TD1n, from which the offset value OF1 is subtracted, and the time digital value TD1n, from which the offset value OF2 is subtracted. Consequently, an A/D conversion error due to the offset values OF1 and OF2 superimposed on the time digital values TD1n is reduced. A/D conversion accuracy is improved.

As explained above, in the A/D conversion circuit 1 in the third embodiment, the sample hold circuit 52 samples and holds the input signal Sin based on the sampling clock signal $CLK_{samp}$, the comparison-reference-signal generator section 10 generates the comparison reference signal Sc, which has the specific waveform, synchronized with the sampling clock signal $CLK_{samp}$, and the comparator 20 compares the voltage $V_{in}$ of the hold signal Sinx and the voltage $V_c$ of the comparison reference signal Sc to thereby generate the trigger signal TRG1. Therefore, according to a voltage of the voltage $V_{in}$ of the hold signal Sinx, generation timing of the trigger signal TRG1 with respect to the sampling clock signal $CLK_{samp}$ changes and generation timing of the trigger signal TRG1n generated based on the trigger signal TRG1 also changes. On the other hand, generation timing of the trigger signal TRG1n generated based on the sampling clock signal $CLK_{samp}$ is fixed irrespective of the voltage of the voltage $V_{in}$ of the hold signal Sinx. Therefore, a phase difference between the trigger signal TRG1n generated based on the trigger signal TRG1 and the trigger signal TRG1n generated based on the sampling clock signal $CLK_{samp}$ changes according to the voltage of the voltage $V_{in}$ of the hold signal Sinx.

Based on the trigger signal TRG1n, the time to digital converter 100A calculates the time digital value TD1n corresponding to the phase difference PD1 between the reference clock signal $CLK_{ref}$ and the trigger signal TRG1 and further calculates the time digital value TD1n corresponding to the phase difference PD2 between the reference clock signal $CLK_{ref}$ and the sampling clock signal $CLK_{samp}$.

Therefore, a difference between the time digital value TD1n corresponding to the phase difference PD1 and the time digital value TD1n corresponding to the phase difference PD2 is a phase difference between the trigger signal TRG1 and the sampling clock signal $CLK_{samp}$, that is, a value corresponding to the voltage of the voltage $V_{in}$ of the hold signal Sinx. Therefore, the digital-signal generator section 42 can generate, based on the time digital values TD1n, the digital signal DO corresponding to the voltage $V_{in}$ of the hold signal Sinx.

In the time to digital converter 100A, the state transition section 110 starts transition of a state based on the trigger signal TRG1 and outputs the state value ST1. The weight operation section 120 performs, on a value based on the state value ST1, weighting corresponding to time elapsing and performs a predetermined arithmetic operation in synchronization with the reference clock signal $CLK_{ref}$ to thereby calculate the time digital value TD1n corresponding to the number of transition times of the state of the state transition section 110. The state transition section 110 starts transition of a state based on the sampling clock signal $CLK_{samp}$ and outputs the state value ST2. The weight operation section 120 performs, on a value based on the state value ST2, weighting corresponding to time elapsing and performs a predetermined operation in synchronization with the reference clock signal $CLK_{ref}$ to thereby calculate the time digital value TD1n corresponding to the number of transition times of the state of the state transition section 110. Consequently, a noise shaping effect is exerted. Noise components due to fluctuation or the like of delay amounts of the elements configuring the A/D conversion circuit 1 shift to a high-frequency band. The time digital value TD1n with a high S/N ratio can be obtained.

In this way, with the A/D conversion circuit 1 in the third embodiment, by using the time to digital converter 100A, the time digital value TD1n with the high S/N ratio can be obtained. Therefore, A/D conversion can be highly accurately performed even if the circuit is not complicated.

In the A/D conversion circuit 1 in the third embodiment, the sample hold circuit 52 samples and holds the input signal Sin based on the sampling clock signal $CLK_{samp}$. The digital signal DO based on the hold signal Sinx is obtained. Therefore, with the A/D conversion circuit 1 in the third embodiment, since the voltage of the hold signal Sinx is fixed even if the voltage of the input signal Sin fluctuates, fluctuation in sampling timing corresponding to the voltage of the input signal Sin is reduced. The A/D conversion can be highly accurately performed.

With the A/D conversion circuit 1 in the third embodiment, since the A/D conversion is performed using one time to digital converter 100A, the size of the A/D conversion circuit 1 can be reduced to be smaller than the size of the A/D conversion circuit 1 in the first embodiment in which two time to digital converters 100A and 100B are used and the size of the A/D conversion circuit 1 in the second embodiment in which three time to digital converters 100A, 100B, and 100C are used.

4. Fourth Embodiment

Concerning an A/D conversion circuit in a fourth embodiment, the same components as the components in the first embodiment, the second embodiment, or the third embodiment are denoted by the same reference numerals and signs and explanation of the components is omitted or simplified. Differences from the first embodiment, the second embodiment, and the third embodiment are mainly explained below.

Figure 19:
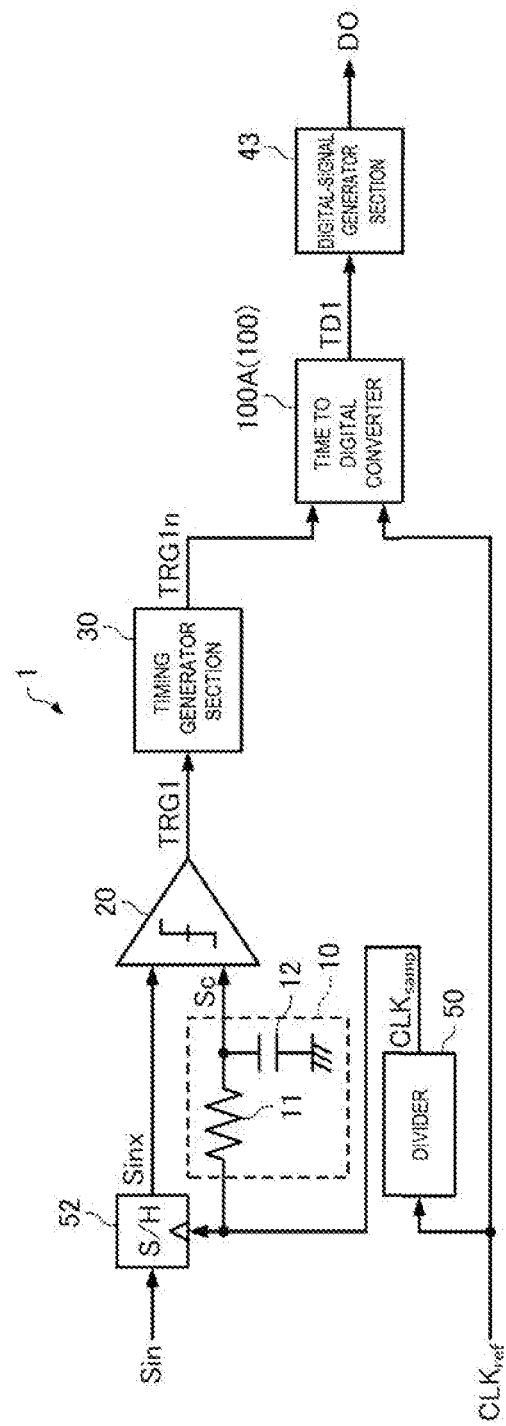
FIG. 19 is a diagram showing the configuration of an A/D conversion circuit in a fourth embodiment.

FIG. 19 is a diagram showing the configuration of the A/D conversion circuit in the fourth embodiment. As shown in FIG. 19, the A/D conversion circuit 1 in the fourth embodiment includes the comparison-reference-signal generator section 10, the comparator 20, the timing generator section 30, a digital-signal generator section 43, the divider circuit 50, the sample hold circuit 52, and the time to digital converter 100A.

The divider circuit 50 divides the reference clock signal $CLK_{ref}$ to generate the sampling clock signal $CLK_{samp}$. Therefore, in this embodiment, the sampling clock signal $CLK_{samp}$ is synchronized with the reference clock signal $CLK_{ref}$.

The sample hold circuit 52 samples and holds the input signal Sin based on the sampling clock signal $CLK_{samp}$ and outputs the hold signal Sinx.

The comparison-reference-signal generator section 10 generates the comparison reference signal Sc, which has a specific waveform, synchronized with the sampling clock signal $CLK_{samp}$. In the fourth embodiment, as in the first embodiment, the second embodiment, and the third embodiment, the comparison-reference-signal generator section 10 includes the resistor 11 and the capacitor 12 configuring an integrator circuit that integrates the sampling clock signal $CLK_{samp}$. The comparison-reference-signal generator section 10 generates the comparison reference signal Sc based on an output signal of the integrator circuit. A division ratio of the divider circuit 50 is set as appropriate according to a time constant of the integrator circuit.

The comparator 20 compares a voltage of the hold signal Sinx, which is the input signal Sin held by the sample hold circuit 52, and a voltage of the comparison reference signal Sc to thereby generate the trigger signal TRG1.

The timing generator section 30 generates, based on the trigger signal TRG1, the trigger signal TRG1n to indicate operation timing of the time to digital converter 100A.

The reference clock signal $CLK_{ref}$ and the trigger signal TRG1n are input to the time to digital converter 100A. The time to digital converter 100A calculates the time digital value TD1 corresponding to a phase difference between the reference clock signal $CLK_{ref}$ and the trigger signal TRG1n. Specifically, the time to digital converter 100A calculates the time digital value TD1 corresponding to the phase difference PD1 between the time event serving as the reference of the reference clock signal $CLK_{ref}$ and a time event of the trigger signal TRG1n.

In this embodiment, since the sampling clock signal $CLK_{samp}$ is synchronized with the reference clock signal $CLK_{ref}$, the phase difference PD2 between the time event serving as the reference of the reference clock signal $CLK_{ref}$ and a time event of the sampling clock signal $CLK_{samp}$ is known. Therefore, the time digital value TD2 corresponding to the phase difference PD2 is also known.

The digital-signal generator section 43 generates, based on the time digital value TD1 and the known time digital value TD2, the digital signal DO corresponding to a voltage of the input signal Sin.

In FIG. 19, the trigger signal TRG1 is equivalent to the "first trigger signal" and the sampling clock signal $CLK_{samp}$ is equivalent to the "second trigger signal". The time digital value TD1 is equivalent to the "first time digital value" and the time digital value TD2 is equivalent to the "second time digital value". The time to digital converter 100A is equivalent to the "first time to digital converter".

In this embodiment, the configuration and the function of the time to digital converter 100A are as explained with reference to FIGS. 2 to 13 above.

The state transition section 110 of the time to digital converter 100A is equivalent to the "first state transition section". The state value ST1 output from the state transition section 110 of the time to digital converter 100A is equivalent to the "first state information". The weight operation section 120 of the time to digital converter 100A is equivalent to the "first weight operation section".

Figure 20:
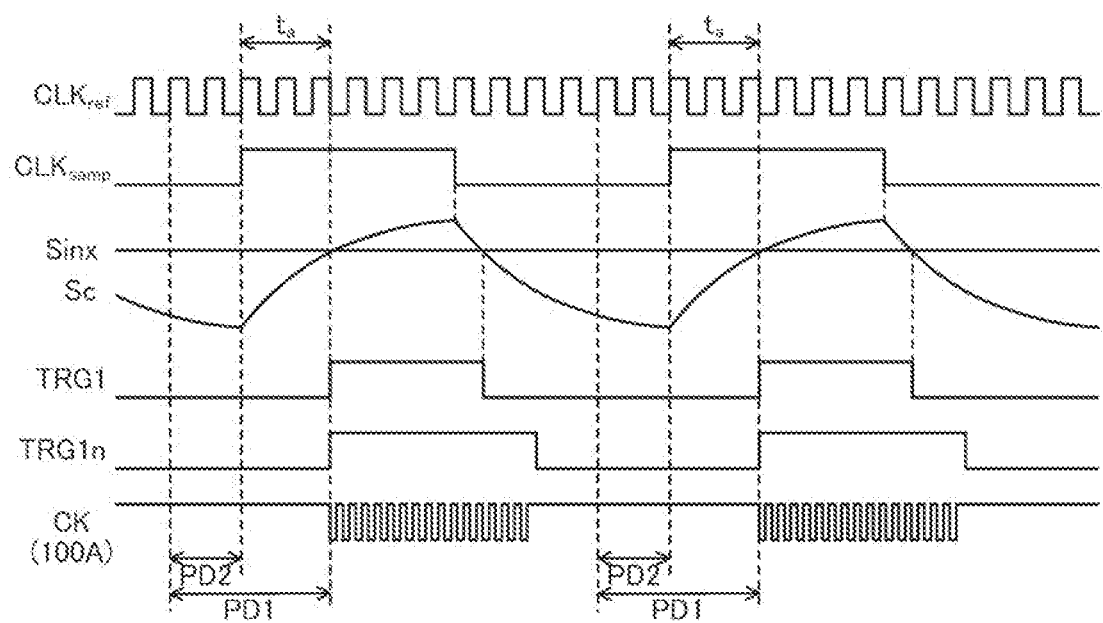
FIG. 20 is a timing chart showing an example of operation timing of the A/D conversion circuit in the fourth embodiment.

FIG. 20 is a timing chart showing an example of operation timing of the A/D conversion circuit 1 in the fourth embodiment.

As shown in FIG. 20, a voltage of the comparison reference signal Sc increases at a time constant determined by the product RC of the resistance value R of the resistor 11 and the capacitance value C of the capacitor 12 in synchronization with rising of the sampling clock signal $CLK_{samp}$.

When the voltage $V_c$ of the comparison reference signal Sc crosses the voltage $V_{in}$ of the input signal Sin at the elapsed time $t_a$ from a rising edge of the sampling clock signal $CLK_{samp}$, the voltage $V_{in}$ is represented by Expression (6) described above. In Expression (6), since the reference voltage $V_{ref}$, the resistance value R of the resistor 11, and the capacitance value C of the capacitor 12 are known, digital values of the reference voltage $V_{ref}$, the resistance value R, and the capacitance value C are also known. If a digital value of the elapsed time $t_a$ is calculated, a digital value of the voltage $V_{in}$ of the hold signal Sinx is calculated.

As shown in FIG. 20, the trigger signal TRG1 is at the high level when the voltage $V_{in}$ of the input signal Sin is lower than the voltage $V_c$ of the comparison reference signal Sc. A rising edge of the trigger signal TRG1n occurs at substantially the same timing as the rising edge of the trigger signal TRG1. As explained above, the time to digital converter 100A generates p pulses of the clock signal CK in a period in which the trigger signal TRG1n is at the high level and generates the time digital value TD1 corresponding to the phase difference PD1 between the time event serving as the reference of the reference clock signal $CLK_{ref}$ and the time event of the trigger signal TRG1.

As explained above, since the sampling clock signal $CLK_{samp}$ is synchronized with the reference clock signal $CLK_{ref}$, the time digital value TD2 corresponding to the phase difference PD2 between the time event serving as the reference of the reference clock signal $CLK_{ref}$ and the time event of the sampling clock signal $CLK_{samp}$ is known.

In an example shown in FIG. 20, a time required from when the state transition section 110 of the time to digital converter 100A starts the state transition until when the time digital value TD1 is obtained is set to not exceed a time of a half cycle of the sampling clock signal $CLK_{samp}$. By setting the time in this way, even when the time to digital converter 100A continuously generates the time digital value TD1, the state transition section 110 can end the present state transition before starting the next state transition.

As shown in FIG. 20, since the elapsed time $t_a$ is equal to a difference between the phase difference PD1 and the phase difference PD2, the difference between the time digital value TD1 and the time digital value TD2 is a time digital value corresponding to the elapsed time $t_a$. Therefore, the digital-signal generator section 43 can calculate a time digital value corresponding to the elapsed time $t_a$ based on the time digital value TD1 and the known time digital value TD2. The digital-signal generator section 43 can calculate a digital value of a voltage of the input signal Sin using the time digital value corresponding to the elapsed time $t_a$ and generate the digital signal DO having the digital value.

To calculate the elapsed time $t_a$, the time constant RC in Expression (6) needs to be known. However, for example, the elapsed time $t_a$ can be calculated from the time digital value TD1 obtained using the input signal Sin, the voltage $V_{in}$ of which is known, and the known time digital value TD2. The time constant RC can be calculated in advance from the elapsed time $t_a$.

The offset value OF1 due to a delay or the like by a wire at the time when the trigger signal TRG1 is propagated to the time to digital converter 100A is superimposed on the time digital value TD1. The offset value OF1 can be calculated in advance from a difference between the time digital value TD1 obtained using the input signal Sin, the voltage $V_{in}$ of which is known, and a theoretical value. The digital-signal generator section 43 may subtract the offset value OF1 from the time digital value TD1 and generate the digital signal DO based on the time digital value TD1, from which the offset value OF1 is subtracted, and the known time digital value TD2. Consequently, an A/D conversion error due to the offset value OF1 superimposed on the time digital value TD1 is reduced. A/D conversion accuracy is improved.

As explained above, in the A/D conversion circuit 1 in the fourth embodiment, the sample hold circuit 52 samples and holds the input signal Sin based on the sampling clock signal $CLK_{samp}$, the comparison-reference-signal generator section 10 generates the comparison reference signal Sc, which has the specific waveform, synchronized with the sampling clock signal $CLK_{samp}$, and the comparator 20 compares the voltage $V_{in}$ of the hold signal Sinx and the voltage $V_c$ of the comparison reference signal Sc to thereby generate the trigger signal TRG1. Therefore, according to a voltage of the voltage $V_{in}$ of the hold signal Sinx, generation timing of the trigger signal TRG1 with respect to the sampling clock signal $CLK_{samp}$ changes. Therefore, a phase difference between the trigger signal TRG1 and the sampling clock signal $CLK_{samp}$ changes according to the voltage of the voltage $V_{in}$ of the hold signal Sinx.

The time to digital converter 100A calculates the time digital value TD1 corresponding to the phase difference PD1 between the reference clock signal $CLK_{ref}$ and the trigger signal TRG1. Since the divider circuit 50 divides the reference clock signal $CLK_{ref}$ and generates the sampling clock signal $CLK_{samp}$, the sampling clock signal $CLK_{samp}$ is synchronized with the reference clock signal $CLK_{ref}$. Therefore, the time digital value TD2 corresponding to a phase difference between the reference clock signal $CLK_{ref}$ and the sampling clock signal $CLK_{samp}$ is a known fixed value. Therefore, a difference between the time digital value TD1 and the time digital value TD2 is a phase difference between the trigger signal TRG1 and the sampling clock signal $CLK_{samp}$, that is, a value corresponding to the voltage of the voltage $V_{in}$ of the hold signal Sinx. Therefore, the digital-signal generator section 43 can generate, based on the time digital value TD1 and the known time digital value TD2, the digital signal DO corresponding to the voltage $V_{in}$ of the hold signal Sinx.

In the time to digital converter 100A, the state transition section 110 starts transition of a state based on the trigger signal TRG1 and outputs the state value ST. The weight operation section 120 performs, on a value based on the state value ST, weighting corresponding to time elapsing and a predetermined arithmetic operation in synchronization with the reference clock signal $CLK_{ref}$ to thereby calculate the time digital value TD1 corresponding to the number of transition times of the state of the state transition section 110. Consequently, a noise shaping effect is exerted. Noise components due to fluctuation or the like of delay amounts of the elements configuring the A/D conversion circuit 1 shift to a high-frequency band. The time digital value TD1 with a high S/N ratio can be obtained.

In this way, with the A/D conversion circuit 1 in the fourth embodiment, by using the time to digital converter 100A, the time digital value TD1 with the high S/N ratio can be obtained. Therefore, A/D conversion can be highly accurately performed even if the circuit is not complicated.

In the A/D conversion circuit 1 in the fourth embodiment, the sample hold circuit 52 samples and holds the input signal Sin based on the sampling clock signal $CLK_{samp}$. The digital signal DO based on the hold signal Sinx is obtained. Therefore, with the A/D conversion circuit 1 in the fourth embodiment, since the voltage of the hold signal Sinx is fixed even if the voltage of the input signal Sin fluctuates, fluctuation in sampling timing corresponding to the voltage of the input signal Sin is reduced. The A/D conversion can be highly accurately performed.

With the A/D conversion circuit 1 in the fourth embodiment, since the A/D conversion is performed using one time to digital converter 100A, the size of the A/D conversion circuit 1 can be reduced to be smaller than the size of the A/D conversion circuit 1 in the first embodiment in which two time to digital converters 100A and 100B are used and the size of the A/D conversion circuit 1 in the second embodiment in which three time to digital converters 100A, 100B, and 100C are used.

With the A/D conversion circuit 1 in the fourth embodiment, the A/D conversion can be performed at every one cycle of the sampling clock signal $CLK_{samp}$. Therefore, it is possible to perform the A/D conversion at higher speed than the A/D conversion circuit 1 in the third embodiment that requires two cycles of the sampling clock signal $CLK_{samp}$ for the A/D conversion.

5. Modifications

In the A/D conversion circuit 1 in the first embodiment, the third embodiment, or the fourth embodiment, the digital-signal generator sections 40, 42, and 43 respectively calculate the time digital value corresponding to the elapsed time $t_a$ from the rising edge of the sampling clock signal $CLK_{samp}$ until when the voltage $V_c$ of the comparison reference signal Sc crosses the voltage $V_{in}$ of the input signal Sin. However, the digital-signal generator sections 40, 42, and 43 may calculate a time digital value corresponding to the elapsed time $t_b$ from the falling edge of the sampling clock signal $CLK_{samp}$ until when the voltage $V_c$ of the comparison reference signal Sc crosses the voltage $V_{in}$ of the input signal Sin. Since the elapsed time $t_b$ is smaller as the voltage $V_{in}$ of the input signal Sin is lower, the digital-signal generator sections 40, 42, and 43 can respectively calculate a digital value of the voltage $V_{in}$ of the input signal Sin using the time digital value corresponding to the elapsed time $t_b$ and generate the digital signal DO having the digital value.

As in the A/D conversion circuit 1 in the second embodiment, in the A/D conversion circuit 1 in the first embodiment, the third embodiment, or the fourth embodiment, the digital-signal generator sections 40, 42, and 43 may each calculate the fluctuation amount ε of the time constant RC and generate the digital signal DO compensated for the fluctuation amount ε.

Figure 21:
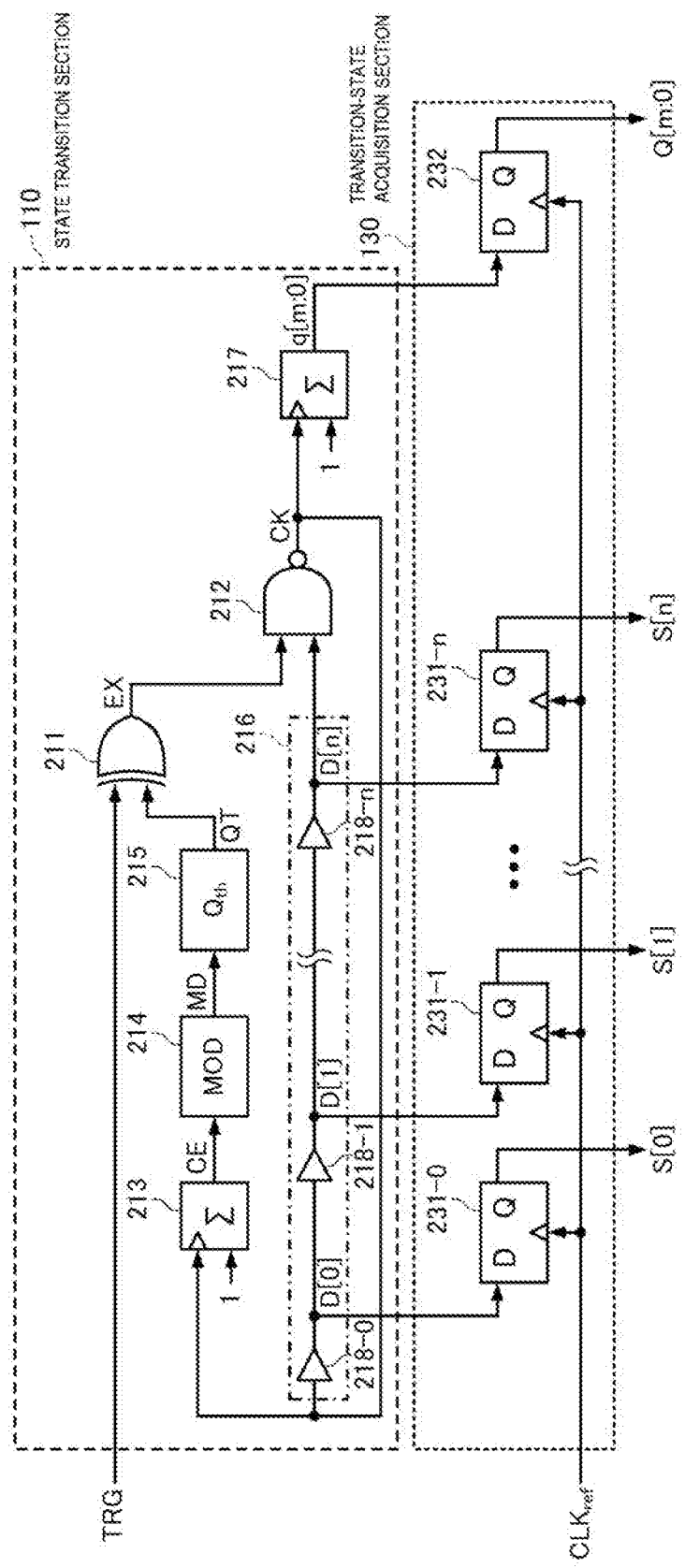
FIG. 21 is a diagram showing the configuration of a state transition section and a transition-state-acquisition section in a modification.

In the embodiments, the state transition section 110 and the transition-state-acquisition section 130 may be modified as shown in FIG. 21. In an example shown in FIG. 21, the state transition section 110 starts state transition, in which an internal state transitions based on the trigger signal TRG, and outputs state information indicating the internal state. As shown in FIG. 21, the state transition section 110 includes an exclusive OR circuit 211, a NOT-AND circuit 212, an accumulator 213, a modulo operator 214, a quantizer 215, a tapped delay line 216, and an accumulator 217.

The exclusive OR circuit 211 outputs the exclusive OR signal EX of the trigger signal TRG and the quantized signal QT output from the quantizer 215. The exclusive OR signal EX is at the high level when the logical level of the trigger signal TRG and the logical level of the quantized signal QT are different and is at the low level when the logical level of the trigger signal TRG and the logical level of the quantized signal QT are the same.

The NOT-AND circuit 212 outputs the clock signal CK, which is an inverted AND signal of the exclusive OR signal EX and a signal D[n] output from the tapped delay line 216. The clock signal CK is at the low level when both of the exclusive OR signal EX and the signal D[n] are at the high level and is at the high level when at least one of the exclusive OR signal EX and the signal D[n] is at the low level.

The accumulator 213 accumulates 1 and outputs the accumulated value CE every time a rising edge of the clock signal CK occurs. In other words, the accumulator 213 counts the rising edge of the clock signal CK and outputs the accumulated value CE. The accumulator 213 may count a falling edge of the clock signal CK.

The modulo operator 214 performs modulo operation with the accumulated value CE as a dividend and with a predetermined value as a divisor. That is, the modulo operator 214 outputs the remainder value MD obtained by dividing the accumulated value CE, which is the dividend, by the predetermined value, which is the divisor. The predetermined value, which is the divisor, is set as appropriate.

The quantizer 215 compares the remainder value MD with a predetermined threshold to thereby output the quantized signal QT obtained by quantizing the remainder value MD. In other words, the quantizer 215 outputs, as the quantized signal QT, a quotient obtained by dividing the remainder value MD, which is the dividend, by the threshold, which is the divisor.

The tapped delay line 216 includes a plurality of delay elements, specifically, n+1 delay elements 218-0 to 218-*n*; n is an integer equal to or larger than 1. The tapped delay line 216 is a delay line in which the n+1 delay elements 218-0 to 218-*n* are coupled in a chain shape and includes one input end and n output ends. Such a tapped delay line 216 is called a multistage delay line as well. The delay elements 218-0 to 218-*n* are respectively buffer elements or logic inversion elements. In the following explanation, it is assumed that all the delay elements 218-0 to 218-*n* are buffer elements.

An input end of the delay element 218-0 at the head of the tapped delay line 216 is an input end of the tapped delay line 216. Output ends of the respective delay elements 218-0 to 218-*n* are n output ends of the tapped delay line 216. From the n output ends of the tapped delay line 216, signals D[0] to D[n] are output in order from an input end side of the tapped delay line 216.

The clock signal CK is input to the input end of the tapped delay line 216. The clock signal CK changes from the low level to the high level and the clock signal CK at the high level is propagated through the delay element 218-0, whereby the signal D[0] changes from the low level to the high level. A signal D[i−1] at the high level is propagated through a delay element 218-*i*, whereby a signal D[i] changes from the low level to the high level; i is any integer equal to or larger than 1 and equal to or smaller than n. That is, signals at the high level are propagated through the delay elements 218-0 to 218-*n* in order and the signals D[0] to D[n] change from the low level to the high level in order.

Similarly, the clock signal CK changes from the high level to the low level and the clock signal CK at the low level is propagated through the delay element 218-0, whereby the signal D[0] changes from the high level to the low level. The signal D[i−1] at the low level is propagated through the delay element 218-*i*, whereby the signal D[i] changes from the high level to the low level; i is any integer equal to or larger than 1 and equal to or smaller than n. That is, signals at the low level are propagated through the delay elements 218-0 to 218-*n* in order and the signals D[0] to D[n+1] change from the high level to the low level in order.

The accumulator 217 accumulates 1 and outputs a m+1-bit signal q[m:0] every time a rising edge of the clock signal CK occurs; m is an integer equal to or larger than 0. In other words, the accumulator 217 counts the rising edge of the clock signal CK and outputs the signal q[m:0]. That is, the signal q[m:0] corresponds to count information of an edge of the clock signal CK. The accumulator 217 may count a falling edge of the clock signal CK.

Figure 22:
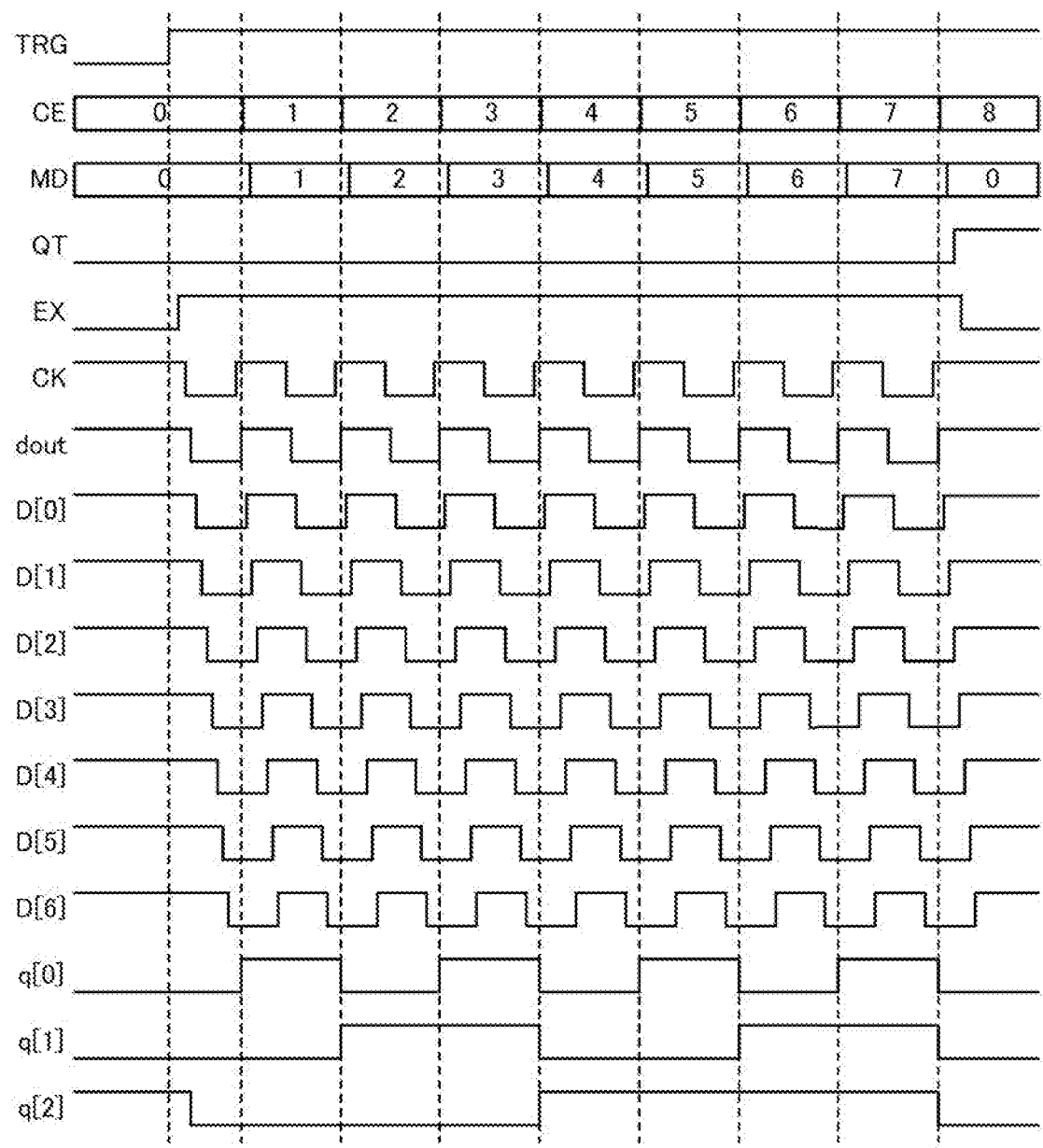
FIG. 22 is a diagram showing an example of waveforms of signals of the state transition section.

FIG. 22 is a diagram showing an example of waveforms of signals of the state transition section 110. FIG. 22 shows an example in which n is 6, m is 2, and the divisor in the modulo operation by the modulo operator 204 is 16, and the threshold of the quantization by the quantizer 205 is 8.

In the example shown in FIG. 22, when the logical level of the trigger signal TRG changes, the exclusive OR signal EX changes from the low level to the high level and the pulse of the clock signal CK is continuously generated in a period in which the exclusive OR signal EX is at the high level. The accumulated value CE increases by one at every rising edge of the clock signal CK. The remainder value MD increases according to the increase in the accumulated value CE and is initialized to 0 every time the accumulated value CE becomes an integer time of 16. The quantized signal QT is at the low level when the remainder value MD is 7 or less and is at the high level when the remainder value MD is 8 or more. When the logical level of the quantized signal QT changes, the exclusive OR signal EX changes from the high level to the low level and the generation of the pulse of the clock signal CK is stopped.

In the example shown in FIG. 22, every time the logical level of the trigger signal TRG changes, the logical level of the clock signal CK is inverted sixteen times and the pulse is generated eight times. However, if the divisor in the modulo operation by the modulo operator 204 and the threshold of the quantization by the quantizer 205 are changed, a pulse number of the clock signal CK also changes. For example, when the divisor in the modulo operation by the modulo operator 204 is 2p and the threshold of the quantization by the quantizer 205 is p, every time the logical level of the trigger signal TRG changes, the logical level of the clock signal CK is inverted 2p times and p pulses are generated. Every time the logical level of the clock signal CK changes, a signal q[2:0] increases by one. Every time the logical level of the clock signal CK changes, bits of a signal D[6:0] change in order.

A value of a 10-bit signal having the signal q[2:0] and the signal D[6:0] changes according to elapse of time. Therefore, when the internal state of the state transition section 110 is defined in association with the value of the 10-bit signal, the state transition section 110 starts state transition, in which the internal state transitions based on the trigger signal TRG, and outputs, as the state information indicating the internal state, the state value ST having the signal q[2:0] output from the accumulator 217 and the signal D[6:0] output from the tapped delay line 216.

Referring back to FIG. 21, the transition-state-acquisition section 130 is a latch circuit that latches and holds, based on a latch signal, the state information output by the state transition section 110. The latch signal is the reference clock signal $CLK_{ref}$. The state information is the state value ST having the signal q[m:0] and the signal D[n:0]. As shown in FIG. 21, the transition-stage acquiring section 130 includes n+1 D flip flops 231-0 to 231-*n* and an m+1-bit register 232 including m+1 D flip flops.

The respective D flip flops 231-0 to 231-*n* acquire the respective signals D[0] to D[n] in synchronization with a rising edge of the reference clock signal $CLK_{ref}$ and hold signals S[0] to S[n] corresponding to logical levels of the respective signals D[0] to D[n].

The register 232 acquires the signal q[m:0] in synchronization with the rising edge of the reference clock signal $CLK_{ref}$ and holds a signal Q[m:0] corresponding to a value of the signal q[2:0].

The transition-state-acquisition section 130 configured in this way functions as a latch circuit that latches and holds, at timing of the rising edge of the reference clock signal $CLK_{ref}$, the state value ST indicating the internal state of the state transition section 110. The transition-state-acquisition section 130 outputs the state value LST having the signal Q[m:0] and a signal S[n:0].

When a value of the signal S[0] is 1, the number of bits having a value of 1 included in the signal S[m:0] indicates the position of the clock signal CK at the high level propagated through the tapped delay line 216 at the timing of the rising edge of the reference clock signal $CLK_{ref}$. Similarly, when the value of the signal S[0] is 0, the number of bits having a value of 0 included in the signal S[m:0] indicates the position of the clock signal CK at the low level propagated through the tapped delay line 216 at the timing of the rising edge of the reference clock signal $CLK_{ref}$. A value of the signal Q[m:0] indicates the number of rising edges of the reference clock signal $CLK_{ref}$.

Therefore, although not illustrated, the state-transition counter section 150 at the post stage of the transition-state-acquisition section 130 can calculate the number of times of state transition of the state transition section 110 from occurrence of a time event of the trigger signal TRG by performing a predetermined arithmetic operation on the state value LST and calculate the count value CNT by calculating a difference between continuous two calculation values of the number of times of state transition.

Figure 23:
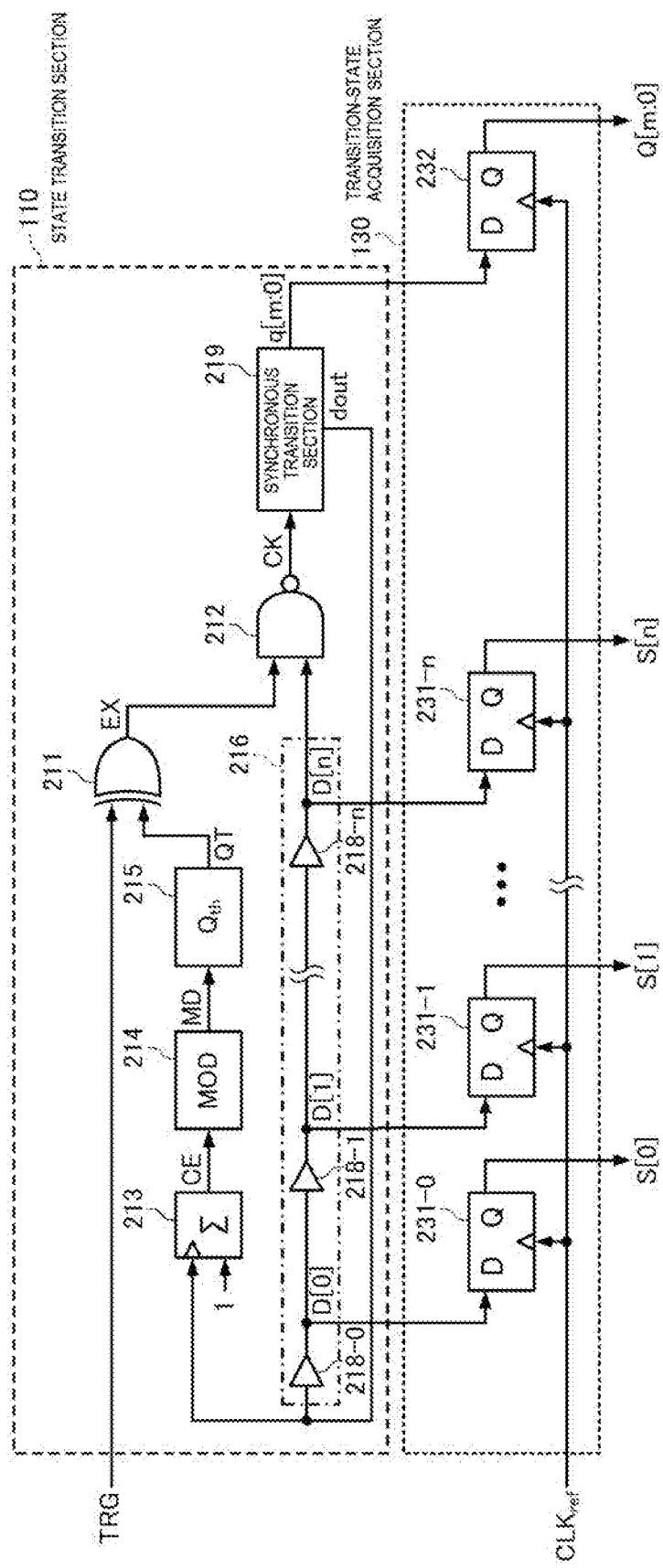
FIG. 23 is a diagram showing the configuration of the state transition section and the transition-state-acquisition section in a modification.

In the embodiments, the state transition section 110 and the transition-state-acquisition section 130 may be modified as shown in FIG. 23. In an example shown in FIG. 23, the state transition section 110 starts state transition, in which the internal state transitions based on the trigger signal TRG, and outputs state information indicating the internal state. As shown in FIG. 23, the state transition section 110 includes the exclusive OR circuit 211, the NOT-AND circuit 212, the accumulator 213, the modulo operator 214, the quantizer 215, the tapped delay line 216, and a synchronous transition section 219.

Explanation of the exclusive OR circuit 211 and the NOT-AND circuit 212 is omitted because the functions of the exclusive OR circuit 211 and the NOT-AND circuit 212 are the same as the functions shown in FIG. 21.

The synchronous transition section 219 counts edges of the clock signal CK output from the NOT-AND circuit 212. The synchronous transition section 219 is a state machine, a state of which transitions in synchronization with the clock signal CK. The m+1-bit signal q[m:0] output from the synchronous transition section 219 is a signal indicating the state; m is an integer equal to or larger than 0. Since the state of the synchronous transition section 219 transitions every time the logical level of the clock signal CK is inverted, the signal q[m:0] corresponds to count information of the edges of the clock signal CK. The synchronous transition section 219 outputs a signal dout supplied to the input end of the tapped delay line 216.

When the state of the synchronous transition section 219 transitions from any state to the next state, only one bit among the m+1 bits of the signal q[m:0] changes. That is, a humming distance of the signal q[m:0] before and after the state transition of the synchronous transition section 219 is 1. For example, the synchronous transition section 219 may be a gray code counter.

A state transition table in the case in which the synchronous transition section 219 is the gray code counter and m is 2 is shown in FIG. 24. In FIG. 24 and the following explanation, the low level and the high level are respectively represented as 0 and 1. In an example shown in FIG. 24, the synchronous transition section 219 has eight states of T0 to T7. In the state T0 in which the signal q[2:0] is "000", if the clock signal CK is at the low level, the synchronous transition section 219 maintains the state T0. If the clock signal CK is at the low level, a bit 0 of the signal q[2:0] changes from 0 to 1 and the synchronous transition section 219 transitions to the state T1. In the state T1 in which the signal q[2:0] is "001", if the clock signal CK is at the low level, a bit 1 of the signal q[2:0] changes from 0 to 1 and the synchronous transition section 219 transitions to the state T2. If the clock signal CK is at the high level, the synchronous transition section 219 maintains the state T1. In the state T2 in which the signal q[2:0] is "011", if the clock signal CK is at the low level, the synchronous transition section 219 maintains the state T2. If the clock signal CK is at the high level, the bit 0 of the signal q[2:0] changes from 1 to 0 and the synchronous transition section 219 transitions to the state T3. In the state T3 in which the signal q[2:0] is "010", if the clock signal CK is at the low level, a bit 2 of the signal q[2:0] changes from 0 to 1 and the synchronous transition section 219 transitions to the state T4. If the clock signal CK is at the high level, the synchronous transition section 219 maintains the state T3. In the state T4 in which the signal q[2:0] is "110", if the clock signal CK is at the low level, the synchronous transition section 219 maintains the state T4. If the clock signal CK is at the high level, the bit 0 of the signal q[2:0] changes from 0 to 1 and the synchronous transition section 219 transitions to the state T5. In the state T5 in which the signal q[2:0] is "111", if the clock signal CK is at the low level, the bit 1 of the signal q[2:0] changes from 1 to 0 and the synchronous transition section 219 transitions to the state T6. If the clock signal CK is at the high level, the synchronous transition section 219 maintains the state T5. In the state T6 in which the signal q[2:0] is "101", if the clock signal CK is at the low level, the synchronous transition section 219 maintains the state T6. If the clock signal CK is at the high level, the bit 0 of the signal q[2:0] changes from 1 to 0 and the synchronous transition section 219 transitions to the state T7. In the state T7 in which the signal q[2:0] is "100", if the clock signal CK is at the low level, the bit 2 of the signal q[2:0] changes from 1 to 0 and the synchronous transition section 219 transitions to the state T0. If the clock signal CK is at the high level, the synchronous transition section 219 maintains the state T7.

In the example shown in FIG. 24, after transitioning from the state T0 to the state T7, the synchronous transition section 219 returns to the state T0. However, in all the state transitions, only one bit of the signal q[2:0] changes. Therefore, the humming distance of the signal q[2:0] before and after the state transition of the synchronous transition section 219 is 1.

In the example shown in FIG. 24, the signal dout is 0 in the state T0, the state T2, the state T4, and the state T6 and is 1 in the state T1, the state T3, the state T5, and the state T7. Therefore, a logical level of the signal dout is inverted every time the state transitions.

Referring back to FIG. 23, the accumulator 213 accumulates 1 and outputs the accumulated value CE every time a rising edge of the signal dout occurs. In other words, the accumulator 213 counts the rising edge of the signal dout and outputs the accumulated value CE. The accumulator 213 may count a falling edge of the signal dout.

Explanation of the functions of the modulo operator 214 and the quantizer 215 is omitted because the functions are the same as the functions shown in FIG. 21. The input signal is the signal dout rather than the clock signal CK. However, explanation of the configuration and the function of the tapped delay line 216 is omitted because the configuration and the function are the same as the configuration and the function shown in FIG. 21.

Figure 25:
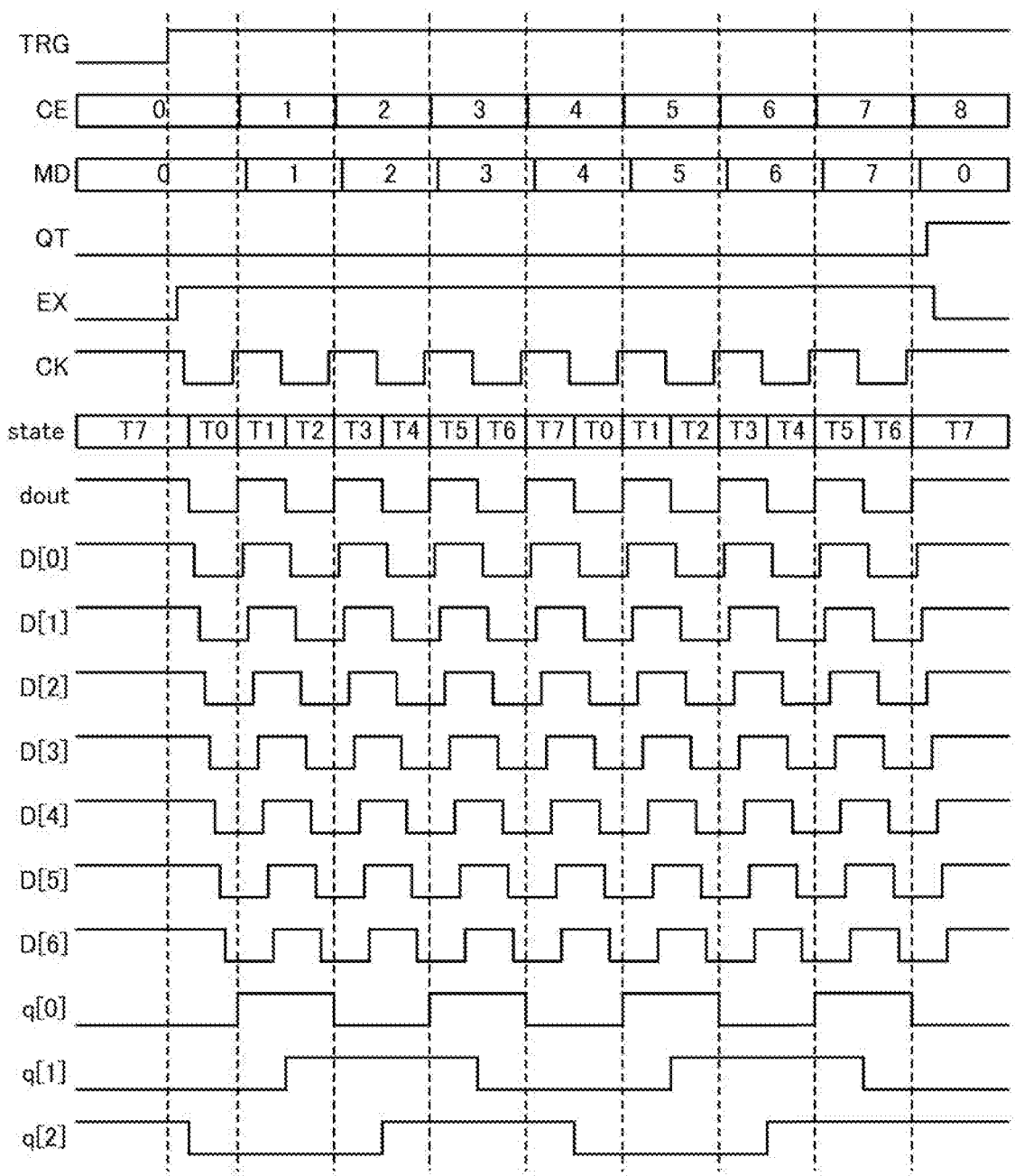
FIG. 25 is a diagram showing an example of waveforms of signals of the state transition section.

FIG. 25 is a diagram showing an example of waveforms of signals of the state transition section 110. FIG. 25 shows an example in which n is 6, m is 2, and the divisor in the modulo operation by the modulo operator 204 is 16, and the threshold of the quantization by the quantizer 205 is 8.

In the example shown in FIG. 25, when the logical level of the trigger signal TRG changes, the exclusive OR signal EX changes from the low level to the high level and the pulse of the clock signal CK is continuously generated in a period in which the exclusive OR signal EX is at the high level. The accumulated value CE increases by one at every rising edge of the clock signal CK. The remainder value MD increases according to the increase in the accumulated value CE and is initialized to 0 every time the accumulated value CE becomes an integer time of 16. The quantized signal QT is at the low level when the remainder value MD is 7 or less and is at the high level when the remainder value MD is 8 or more. When the logical level of the quantized signal QT changes, the exclusive OR signal EX changes from the high level to the low level and the generation of the pulse of the clock signal CK is stopped.

In the example shown in FIG. 25, every time the logical level of the trigger signal TRG changes, the logical level of the clock signal CK is inverted sixteen times and the pulse is generated eight times. However, if the divisor in the modulo operation by the modulo operator 204 and the threshold of the quantization by the quantizer 205 are changed, a pulse number of the clock signal CK also changes. For example, when the divisor in the modulo operation by the modulo operator 204 is 2p and the threshold of the quantization by the quantizer 205 is p, every time the logical level of the trigger signal TRG changes, the logical level of the clock signal CK is inverted 2p times and p pulses are generated. Every time the logical level of the clock signal CK changes, the state of the synchronous transition section 219, that is, one bit of the signal q[2:0] changes and the logical level of the signal dout also changes. Every time the logical level of the signal dout changes, bits of a signal D[6:0] change in order.

A value of a 10-bit signal having the signal q[2:0] and the signal D[6:0] changes according to elapse of time. Therefore, when the internal state of the state transition section 110 is defined in association with the value of the 10-bit signal, the state transition section 110 starts state transition, in which the internal state transitions based on the trigger signal TRG, and outputs, as the state information indicating the internal state, the state value ST having the signal q[2:0] output from the synchronous transition section 219 and the signal D[6:0] output from the tapped delay line 216.

Referring back to FIG. 23, the transition-state-acquisition section 130 functions as a latch circuit that latches and holds, at timing of the rising edge of the reference clock signal $CLK_{ref}$, the state value ST indicating the internal state of the state transition section 110. The transition-state-acquisition section 130 outputs the state value LST having the signal Q[m:0] and the signal S[n:0]. The function of the transition-state-acquisition section 130 is the same as the function shown in FIG. 21. Therefore, detailed explanation of the function is omitted.

When a value of the signal S[0] is 1, the number of bits having a value of 1 included in the signal S[m:0] indicates the position of the signal dout at the high level propagated through the tapped delay line 216 at the timing of the rising edge of the reference clock signal $CLK_{ref}$. Similarly, when the value of the signal S[0] is 0, the number of bits having a value of 0 included in the signal S[m:0] indicates the position of the signal dout at the low level propagated through the tapped delay line 216 at the timing of the rising edge of the reference clock signal $CLK_{ref}$. A value of the signal Q[m:0] indicates the number of edges of the reference clock signal $CLK_{ref}$.

Therefore, although not illustrated, the state-transition counter section 150 at the post stage of the transition-state-acquisition section 130 can calculate the number of times of state transition of the state transition section 110 from occurrence of a time event of the trigger signal TRG by performing a predetermined arithmetic operation on the state value LST and calculate the count value CNT by calculating a difference between continuous two calculation values of the number of times of state transition.

When the internal state of the state transition section 110 transitions from any state to the next state, the state value ST having the signal q[m:0] and the signal D[n:0] changes by only one bit. That is, the humming distance of the state information before and after the state transition of the state transition section 110 is 1. Therefore, when transitioning from any state to the next state, the state transition section 110 does not pass through other states. Therefore, even when timing of the rising edge of the reference clock signal $CLK_{ref}$ and timing of the state transition of the state transition section 110 substantially coincide, the transition-state-acquisition section 130 can latch the state value ST corresponding to one of two states before and after the state transition. Therefore, likelihood that the transition-state-acquisition section 130 acquires wrong state information is reduced.

The present disclosure is not limited to the embodiments. Various modified implementations of the present disclosure are possible within the scope of the gist of the present disclosure.

For example, a part of the first embodiment may be replaced with a part of any one of the second embodiment to the fourth embodiment as appropriate. Similarly, a part of the second embodiment may be replaced with a part of any one of the first embodiment, the third embodiment, and the fourth embodiment as appropriate. Similarly, a part of the third embodiment may be replaced with a part of any one of the first embodiment, the second embodiment, and the fourth embodiment as appropriate. Similarly, a part of the fourth embodiment may be replaced with a part of any one of the first embodiment to the third embodiment as appropriate.

The embodiments and the modifications explained above are examples. The present disclosure is not limited to the embodiments and the modifications. For example, the embodiments and the modifications can be combined as appropriate.

The present disclosure includes substantially the same configuration as the configuration explained in the embodiments (for example, a configuration, a function, a method, and a result of which are the same as those in the embodiments or a configuration, a purpose, and an effect of which are the same as those in the embodiments). The present disclosure includes a configuration in which a nonessential portion of the configuration explained in the embodiments is replaced. The present disclosure includes a configuration that can accomplish the same action effects as the action effects explained in the embodiments or a configuration that can achieve the same purpose as the purpose of the embodiments. The present disclosure includes a configuration in which a publicly-known technique is added to the configuration explained in the embodiments.

What is claimed is:

1. An A/D conversion circuit comprising:
a comparison-reference-signal generator section configured to generate a comparison reference signal, which has a specific waveform, synchronized with a sampling clock signal;
a comparator configured to compare a voltage of an input signal and a voltage of the comparison reference signal to thereby generate a first trigger signal;
a first time to digital converter configured to calculate a first time digital value corresponding to a phase difference between a reference clock signal and the first trigger signal; and
a digital-signal generator section configured to generate, based on the first time digital value and a second time digital value corresponding to a phase difference between the reference clock signal and a second trigger signal based on the sampling clock signal, a digital signal corresponding to the voltage of the input signal, wherein
the first time to digital converter includes:
a first state transition section configured to start transition of a state based on the first trigger signal and output first state information indicating the state; and
a first weight operation section configured to, in synchronization with the reference clock signal, perform, on a value based on the first state information, weighting corresponding to time elapsing and perform a predetermined arithmetic operation to thereby calculate the first time digital value corresponding to a number of transition times of the state of the first state transition section.

2. The A/D conversion circuit according to claim 1, wherein
the first state transition section starts the transition of the state based on the second trigger signal and outputs second state information indicating the state, and
the first weight operation section performs, on a value based on the second state information, the weighting corresponding to the time elapsing and performs the arithmetic operation in synchronization with the reference clock signal to thereby calculate the second time digital value corresponding to the number of transition times of the state of the first state transition section.

3. The A/D conversion circuit according to claim 1, further comprising a second time to digital converter configured to calculate the second time digital value, wherein
the second time to digital converter includes:
a second state transition section configured to start transition of a state based on the second trigger signal and output second state information indicating the state; and
a second weight operation section configured to, in synchronization with the reference clock signal, perform, on a value based on the second state information, weighting corresponding to time elapsing and perform the arithmetic operation to thereby calculate the second time digital value corresponding to a number of transition times of the state of the second state transition section.

4. The A/D conversion circuit according to claim 3, further comprising a third time to digital converter configured to calculate a third time digital value corresponding to a phase difference between the reference clock signal and a third trigger signal synchronized with the first trigger signal, wherein
the third time to digital converter includes:
a third state transition section configured to start transition of a state based on the third trigger signal and output third state information indicating the state; and
a third weight operation section configured to, in synchronization with the reference clock signal, perform, on a value based on the third state information, weighing corresponding to time elapsing and perform the arithmetic operation to thereby calculate the third time digital value corresponding to a number of transition times of the state of the third state transition section, and
the digital-signal generator section generates the digital signal based on the first time digital value, the second time digital value, and the third time digital value.

5. The A/D conversion circuit according to claim 1, wherein the comparison-reference-signal generator section includes an integrator circuit configured to integrate the sampling clock signal and generates the comparison reference signal based on an output signal of the integrator circuit.

6. The A/D conversion circuit according to claim 5, wherein the digital-signal generator section calculates a fluctuation amount of a time constant of the integrator circuit based on the first time digital value, the second time digital value, and a third time digital value corresponding to a phase difference between the reference clock signal and a third trigger signal synchronized with the first trigger signal and generates the digital signal compensated for the fluctuation amount.

7. The A/D conversion circuit according to claim 1, further comprising a sample hold circuit configured to sample and hold the input signal based on the sampling clock signal, wherein
the comparator compares a voltage of the input signal held by the sample hold circuit and the voltage of the comparison reference signal to thereby generate the first trigger signal.

8. The A/D conversion circuit according to claim 1, wherein the sampling clock signal is synchronized with the reference clock signal.

9. The A/D conversion circuit according to claim 1, wherein the digital-signal generator section subtracts an offset value from the first time digital value and generates the digital signal based on the first time digital value from which the offset value is subtracted.

* * * * *